(12) United States Patent
Hirata

(10) Patent No.: US 7,157,930 B2
(45) Date of Patent: Jan. 2, 2007

(54) SCAN FLIP FLOP, SEMICONDUCTOR DEVICE, AND PRODUCTION METHOD OF SEMICONDUCTOR DEVICE

(75) Inventor: Akio Hirata, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 82 days.

(21) Appl. No.: 11/013,886

(22) Filed: Dec. 17, 2004

(65) Prior Publication Data

US 2005/0151560 A1    Jul. 14, 2005

(30) Foreign Application Priority Data

Dec. 22, 2003    (JP)    ............. 2003-424603

(51) Int. Cl.
 *H03K 19/00* (2006.01)
(52) U.S. Cl. ............... 326/16; 326/95; 326/98
(58) Field of Classification Search ............... 326/16, 326/93–98
See application file for complete search history.

(56) References Cited

U.S. PATENT DOCUMENTS 5,041,742 A * 8/1991 Carbonaro ............... 326/97
5,898,330 A   4/1999 Klass
6,744,282 B1 * 6/2004 Dhong et al. ............. 326/93

OTHER PUBLICATIONS

Fabian Klass; "Semi-Dynamic and Dynamic Flip-Flops with Embedded Logic"; *1998 Symposium on VLSI Circuits Digest of Technical Papers*; c. 1998; pp. 108 & 109; Sun Microsystems Inc.

* cited by examiner

*Primary Examiner*—Anh Q. Tran
(74) *Attorney, Agent, or Firm*—McDermott Will & Emery LLP

(57) ABSTRACT

There is provided a flip flop circuit with a scan structure which is formed by an input section of a dynamic circuit and an output section of a static circuit wherein data is taken in within an interval of a short pulse width as compared with a clock cycle. In the dynamic circuit of the input section, the number of serially-connected MOS transistors to which a data signal is input is smaller than the number of serially-connected MOS transistors to which a test input signal is input. With this structure, the speed of operation is increased at the time of data storage for a data signal input, and the number of MOS transistors is reduced.

15 Claims, 12 Drawing Sheets

SLC0 Selection signal generation circuit

US 7,157,930 B2

SCAN FLIP FLOP, SEMICONDUCTOR DEVICE, AND PRODUCTION METHOD OF SEMICONDUCTOR DEVICE

CROSS-REFERENCE TO RELATED APPLICATIONS

This application claims priority under 35 U.S.C. § 119(a) on Japanese Patent Application No. 2003-424603 filed on Dec. 22, 2003 and Japanese Patent Application No. 2004-336355 filed on Nov. 19, 2004, the entire contents of which are hereby incorporated by reference.

BACKGROUND OF THE INVENTION

The present invention relates to a scan flip flop which is capable of high speed operation and which can be formed by a small number of transistors.

In a logic circuit of a semiconductor integrated circuit, a flip flop greatly influences the area, power consumption, and critical path delay, and therefore, reduction in the area of the flip flop, reduction in the power consumption, and higher processing speed have been demanded. A scan flip flop has been used in many devices for readily achieving a test for a designed LSI circuit. Especially, reduction in the area, reduction in the power consumption, and increase in the operation speed are significant challenges in the scan flip flop.

In recent years, a flip flop using a latch circuit which takes in data within a pulse width period shorter than a clock cycle has been proposed for high speed processing applications. Hereinafter, a conventional example of a flip flop having such a structure is described with reference to the circuit diagrams of FIGS. 11 and 12.

FIG. 11 shows a scan flip flop called a SDFF (Semi-Dynamic Flip-Flop), which is an exemplary structure disclosed in the specification of U.S. Pat. No. 5,898,330 (hereinafter, referred to as "conventional example 1").

In FIG. 11, "D" denotes a data signal, "CK" denotes a clock signal, "SI" denotes a test input signal, "SCAN" denotes a test selection signal, "Q" denotes an output signal, "VDD" denotes a VDD power supply, and "GND" denotes a GND potential.

Reference numerals "N20" to "N23" denote nMOS transistors. The series connection of the nMOS transistors N20 and N21 and the series connection of the nMOS transistors N22 and N23 are connected in parallel to constitute a selector circuit S0. In this structure, any one of the control of the nMOS transistor N21 based on data signal D and the control of the nMOS transistor N23 based on test input signal SI is exclusively selected by the nMOS transistor N20 which is controlled by an inversion signal of test selection signal SCAN from an inverter circuit INV7 and the nMOS transistor N22 which is controlled by test selection signal SCAN.

Reference numeral "P1" denotes a pMOS transistor having a source connected to the VDD power supply, and reference numeral "N3" denotes an nMOS transistor having a source connected to the GND potential. Clock signal CK is input to the gate of the pMOS transistor P1 and the gate of the nMOS transistor N3. An nMOS transistor N1 is connected in series to the drain of the pMOS transistor P1. The selector circuit S0 is inserted in series between the source of the nMOS transistor N1 and the drain of the nMOS transistor N3. The drain of the pMOS transistor P1 and the drain of the nMOS transistor N1 are connected at a connection node X1. The output terminal of a 2-input NAND circuit ND1 is connected to the gate of the nMOS transistor N1. One of the input terminals of the NAND circuit ND1 is connected to the connection node X1, and the other input terminal of the NAND circuit ND1 receives clock signal CK delayed by two inverter circuits INV1 and INV2. The inverter circuit INV2 and one input terminal of the NAND circuit ND1 are connected at a connection node CKD.

The node X1 is connected to the gate of a pMOS transistor P2 and the gate of an nMOS transistor N5. The source of the pMOS transistor P2 is connected to the VDD power supply. The source of the nMOS transistor N5 is connected to the GND potential. An nMOS transistor N4 is connected in series between the pMOS transistor P2 and the nMOS transistor N5. The gate of the nMOS transistor N4 receives clock signal CK. Herein, the output potential obtained from the connection node of the pMOS transistor P2 and the nMOS transistor N4 is output signal Q.

A latch circuit formed by inverter circuits INV3 and INV4 is connected to the node X1. A latch circuit formed by inverter circuits INV5 and INV6 is connected to the drain of a pMOS transistor which outputs output signal Q.

Next, an operation of the scan flip flop having the above structure is described.

In the first place, the operation carried out when test selection signal SCAN is at the low level, i.e., when data signal D is selected, is described.

In a period when clock signal CK is at the low level, the pMOS transistor P1 is turned on so that the potential of the node X1 rises to the high level. In this case, the nMOS transistor N4 and the pMOS transistor P2 are cut off, and therefore, output signal Q is retained unchanged at the previous value.

Then, when clock signal CK transitions to the high level, the potential of the node CKD does not immediately transition to the high level. The transition of the potential of the node CKD to the high level is delayed by the inverter circuits INV1 and INV2. During the time when clock signal CK is at the high level and the potential of the node CKD is at the low level (hereinafter, referred to as "evaluation period"), the nMOS transistor N1 is in the on state. If data signal D is at the high level during this period, the node X1 transitions from the high level to the low level, and output signal Q is raised to the high level by the pMOS transistor P2. If data signal D is at the low level during the evaluation period, the node X1 remains at the high level, and output signal Q is lowered to the low level by the nMOS transistors N4 and N5.

Then, the state where clock signal CK is at the high level and the potential of the node CKD is at the high level (hereinafter, referred to as "retainment period") is entered. If the potential of the node X1 is at the high level at this timing, the nMOS transistor N1 is cut off by the 2-input NAND circuit ND1. Thus, the high level potential is retained by the inverter circuits INV3 and INV4 without being influenced by the value of data signal D. In the case where the node X1 is at the low level and the retainment period is entered, the pMOS transistor P1 is cut off. Therefore, the potential of the node X1 is retained at the low level by the inverter circuits INV3 and INV4 irrespective of the value of data signal D.

In general, an inverter circuit is formed by 2 MOS transistors, and a 2-input NAND circuit is formed by 4 MOS transistors. Thus, the flip flop circuit of conventional example 1 shown in FIG. 11 is formed by 28 MOS transistors in total.

FIG. 12 shows another structure example of a scan flip flop circuit called a SDFF (hereinafter, referred to as "conventional example 2"). It should be noted that like elements are denoted by like reference numerals used in FIG. 11, and the descriptions thereof are herein omitted.

The scan flip flop of FIG. 12 has the same function as that of the scan flip flop of FIG. 11. However, the scan flip flop of FIG. 12 is different from the scan flip flop of FIG. 11 in that the nMOS transistor N1 and the NAND circuit ND1 of conventional example 1, which are provided for retaining the potential of the node X1 (corresponding to a node n1 of FIG. 12) at the high level during the retainment period, are omitted and an AND/OR inverter circuit AOI1 and an AND/OR inverter circuit AOI2 are added instead. The AND/OR inverter circuit AOI1 is formed by a 2-input AND circuit and an OR inverter circuit to which the output of the 2-input AND circuit and test selection signal SCAN are input. The AND/OR inverter circuit AOI2 is formed by a 2-input AND circuit and an OR inverter circuit to which the output of the 2-input AND circuit and an inversion signal of test selection signal SCAN from the inverter circuit INV7 are input. With this structure, when clock signal CK rises from the low level to the high level while data signal D is at the low level, the potential of the node CKD transitions from the low level to the high level during the retainment period. Therefore, the nMOS transistors N20 and N22 are cut off irrespective of the value of test selection signal SCAN. Thus, the structure of FIG. 12 also achieves the function of retaining the potential of the node X1 at the high level irrespective of the value of data signal D as achieved with the nMOS transistor N1 of FIG. 11.

In general, an AND/OR inverter circuit is formed by 6 MOS transistors. Thus, the circuit shown in FIG. 12 is formed by 35 MOS transistors in total.

However, in the conventional scan flip flop of FIG. 11, the number of transistors which operate based on data signal D between the node X1 and the ground is 4, i.e., there are four nMOS transistors N1, N20, N21 and N3 serially connected between the node X1 and the ground. This structure causes a long delay time in a transition of the potential of the node X1.

In the conventional flip flop of FIG. 12, one of the serially-connected transistors is removed for reducing the delay time. However, the total number of transistors is increased because of the AND/OR inverter circuits AOI1 and AOI2 which are added for maintaining the same function. As a result, the number of MOS transistors used in the entire flip flop is increased.

SUMMARY OF THE INVENTION

The present invention overcomes the above-described problems. An objective of the present invention is to decrease the number of transistors on a signal transmission route, such as serially-connected transistors used for signal transmission in a data input process, and the like, thereby increasing the operation speed and reducing the total number of transistors.

In order to achieve the above objective, according to the present invention, in a selection circuit which selects a data signal or a test signal, the number of serially-connected transistors to which the data signal is input is reduced to achieve higher operation speed, while the number of serially-connected transistors to which the test signal is input, which do not require a high speed operation, is not reduced, whereby an increase in the number of transistors which may be caused by the reduction of the transistors to which the data signal is input is suppressed.

A scan flip flop of the present invention comprises: an input section including a plurality of nMOS transistors, which receives first logic information and outputs second logic information based on the first logic information, the first logic information including a clock signal, a data signal, a test input signal, and a test selection signal; an output section for receiving information generated based on at least the second logic information and outputting a signal based on the second logic information; a control section for outputting to the input section a control signal which is used by the input section for generating the second logic information from the first logic information; and a first node for transmitting the second logic information from the input section to the output section, wherein the input section includes a selection section for selecting, based on the test selection signal, which of the data signal and the test input signal of the first logic information is validated to generate the second logic information when the clock signal transitions from the low level to the high level, the input section outputs the second logic information to the first node as a high level signal when the clock signal is at the low level, and the number of the nMOS transistors included in a route through which an electric current flows when the first node transitions from the high level to the low level in the input section is different between a case where the data signal is selected and a case where the test input signal is selected.

In the scan flip flop of the present invention, the input section is connected to the control section through first, second and third nodes to operate such that when the clock signal is at the low level, the input section outputs a high level signal to the first node, in the case where the data signal is at the high level, if the potential of the third node is at the high level when the input state transitions from the first state where the test selection signal is at the low level and the clock signal is at the low level to the second state where the test selection signal is at the low level and the clock signal is at the high level, the input section shifts the potential of the first node from the high level to the low level within a predetermined time and retains the potential of the first node at the low level during the second state irrespective of the levels of the data signal and the test input signal, in the case where the data signal is at the low level, when the input state transitions from the first state to the second state, the input section retains the potential of the first node at the high level, and when the potentials of the second and third nodes transition from the high level to the low level at a time after the lapse of the predetermined time, the input section retains the potential of the first node at the high level during the second state irrespective of the levels of the data signal and the test input signal, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level within a predetermined time and retains the potential of the first node at the low level during the fourth state irrespective of the levels of the data signal and the test input signal, in the case where the test input signal is at the low level, if the potential of the third node is at the low level at the transition of the input state from the third state to the fourth state, the input section retains the potential of the first node at the high level, and when the potential of the second node transitions from the high level to the low level at a time after the lapse of the predetermined time, the input section retains the potential of the first node at the high level during the fourth state irrespective of the levels of the data signal and the test input signal; the control section operates such that: in the case where the data signal is at the low level, when the input state transitions from the first state to the second state, the control section shifts the potentials of the second and third nodes from the high level to the low level at a time after the lapse of the predetermined time, in the case where the test input signal is at the low level, when the input state transitions from the third state to the fourth state, the control section shifts the potential of the second node from the high level to the low level at a time after the lapse of the predetermined time and retains the potential of the third node at the low level; and the output section operates such that when the clock signal is at the high level, the output section outputs an inversion signal of a signal at the first node as an output signal, and when the clock signal is at the low level, the output section retains the level of a previous signal.

In the scan flip flop of the present invention, the input section is connected to the control section through first, second and third nodes to operate such that when the clock signal is at the low level, the input section outputs a high level signal to the first node, in the case where the data signal is at the high level, if the potential of the third node is at the high level when the input state transitions from the first state where the test selection signal is at the low level and the clock signal is at the low level to the second state where the test selection signal is at the low level and the clock signal is at the high level, the input section shifts the potential of the first node from the high level to the low level and retains the potential of the first node at the low level during the second state irrespective of the states of the data signal and the test input signal, in the case where the data signal is at the low level, when the input state transitions from the first state to the second state, the input section retains the potential of the first node at the high level, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level and retains the potential of the first node at the low level during the fourth state irrespective of the levels of the data signal and the test input signal, and in the case where the test input signal is at the low level, if the potential of the third node is at the low level at the transition of the input state from the third state to the fourth state, the input section retains the potential of the first node at the high level; the control section operates such that in the case where the data signal is at the high level, at the transition of the input state from the first state to the second state, the control section retains the potentials of the second and third nodes at the high level according to a potential change of the first node from the high level to the low level, in the case where the data signal is at the low level, at the transition of the input state from the first state to the second state, the control section shifts the potentials of the second and third nodes from the high level to the low level according to a signal at the first node which is retained at the high level, in the case where the test input signal is at the high level, at the transition of the input state from the third state to the fourth state, the control section retains the potentials of the second and third nodes at the high level according to a potential change of the first node from the high level to the low level, and in the case where the test input signal is at the low level, at the transition of the input state from the third state to the fourth state, the control section shifts the potential of the second node from the high level to the low level and retains the potential of the third node at the low level according to a signal at the first node which is retained at the high level; and the output section operates such that when the clock signal is at the high level, the output section outputs an inversion signal of a signal at the first node as an output signal, and when the clock signal is at the low level, the output section retains the level of a previous signal.

In the scan flip flop of the present invention, the input section and the control section is connected to each other through first, second and third nodes; the control section and the output section are connected to each other through the fourth and fifth nodes; the input section operates such that when the clock signal is at the low level, the input section outputs a high level signal to the first node, in the case where the data signal is at the high level, if the potential of the third node is at the high level when the input state transitions from the first state where the test selection signal is at the low level and the clock signal is at the low level to the second state where the test selection signal is at the low level and the clock signal is at the high level, the input section shifts the potential of the first node from the high level to the low level and retains the potential of the first node at the low level during the second state irrespective of the potentials of the data signal and the test input signal, in the case where the data signal is at the low level, when the input state transitions from the first state to the second state, the input section retains the potential of the first node at the high level, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level and retains the potential of the first node at the low level during the fourth state irrespective of the potentials of the data signal and the test input signal, and in the case where the test input signal is at the low level, if the potential of the third node is at the low level at the transition of the input state from the third state to the fourth state, the input section retains the potential of the first node at the high level; the control section operates such that in the case where the data signal is at the high level, at the transition of the input state from the first state to the second state, the control section retains the potentials of the second and third nodes at the high level, retains the potential of the fourth node at the high level, and shifts the potential of the fifth node from the low level to the high level, according to a signal at the first node which transitions from the high level to the low level, in the case where the data signal is at the low level, at the transition of the input state from the first state to the second state, the control section shifts the potentials of the second and third nodes from the high level to the low level, shifts the potential of the fourth node from the high level to the low level, and retains the potential of the fifth node at the low level, according to a signal at the first node which is retained at the high level, in the case where the test input signal is at the high level, at the transition of the input state from the third state to the fourth state, the control section retains the potential of the second node at the high level and the potential of the third node at the low level, retains the potential of the fourth node at the high level, shifts the potential of the fifth node from the low level to the high level, according to a signal at the first node which transitions from the high level to the low level, and in the case where the test input signal is at the low level, at the transition of the input state from the third state to the fourth state, the control section shifts the potential of the second node from the high level to the low level, retains the potential of the third node at the low level, shifts a signal at the fourth node from the high level to the low level, and retains the potential of the fifth node at the low level, according to a signal at the first node which is retained at the high level; and the output section operates such that when the output section receives high level signals from the fourth and fifth node, the output section outputs a high level output signal and a low level inverted output signal, when the output section receives low level signals from the fourth and fifth node, the output section outputs a low level output signal and a high level inverted output signal, and when a high level signal is received at the fourth node and a low level signal is received at the fifth node, the output section retains the levels of the output signal and the inverted output signal at previous levels.

In the scan flip flop of the present invention, the number of the nMOS transistors included in a route through which an electric current flows when the first node transitions from the high level to the low level is smaller in a case where the data signal is selected than in a case where the test input signal is selected.

In the scan flip flop of the present invention, the number of the nMOS transistors is 3 when the data signal is selected; and the number of the nMOS transistors is 4 when the test input signal is selected.

In the scan flip flop of the present invention, the number of the nMOS transistors is 2 when the data signal is selected; and the number of the nMOS transistors is 3 when the test input signal is selected.

In the scan flip flop of the present invention, the control section operates such that in the case where the data signal is at the high level, at the transition of the input state from the first state to the second state, the control section outputs a high level signal to the fifth node according to a potential change of the first node from the high level to the low level, in the case where the data signal is at the low level, at the transition of the input state from the first state to the second state, the control section outputs a low level signal to the fifth node according to a signal at the first node which is retained at the high level, in the case where the test input signal is at the high level, at the transition of the input state from the third state to the fourth state, the control section outputs a high level signal to the fifth node according to a potential change of the first node from the high level to the low level, in the case where the test input signal is at the low level, at the transition of the input state from the third state to the fourth state, the control section outputs a low level signal to the fifth node according to a signal at the first node which is retained at the high level; and the control section further comprises a sixth node for transmitting an inversion signal of a signal at the fourth node, an inverter circuit between the sixth node and the second node for transmitting an inversion signal of a signal at the sixth node to the second node, and a 2-input NOR circuit which receives the signal at the sixth node and the test selection signal and outputs a result of a NOR logic operation of the received signals to the third node.

In the scan flip flop of the present invention, the 2-input NOR circuit is formed by a series connection of a series circuit of two pMOS transistors and a parallel circuit of two nMOS transistors, one of the pMOS transistors being connected to a supply potential, the nMOS transistors being connected to a ground potential; the inverter circuit is a CMOS inverter; and the pMOS transistor of the 2-input NOR circuit which is connected to the supply potential and a pMOS transistor included in the CMOS transistor are realized by one pMOS transistor.

A semiconductor device of the present invention comprises: any of the aforementioned scan flip flops; and a data signal generation circuit for generating the data signal which is to be input to the scan flip flop, wherein the data signal generation circuit is placed adjacent to the scan flip flop.

A semiconductor device production method of the present invention comprises the steps of: placing any of the aforementioned scan flip flop; placing a data signal generation circuit for generating a data signal for the scan flip flop to be adjacent to the scan flip flop; placing a circuit other than the data signal generation circuit; and forming a wire with a priority put on the data signal for the scan flip flop.

A scan flip flop of the present invention comprises: an input section including a plurality of nMOS transistors, which receives first logic information and outputs second logic information based on the first logic information, the first logic information including a clock signal, a data signal group containing a plurality of data signals, a data selection signal, a test input signal, and a test selection signal; an output section for receiving information generated based on at least the second logic information and outputting a signal based on the second logic information; a control section for outputting to the input section a control signal which is used by the input section for generating the second logic information from the first logic information; and a first node for transmitting the second logic information from the input section to the output section, wherein the input section includes a selection section for selecting, based on the test selection signal, which of the data signal group and the test input signal of the first logic information is validated to generate the second logic information when the clock signal transitions from the low level to the high level, the input section includes in the selection section an nMOS logic block which receives the data signal group and selects among the input data signal group a predetermined validated data signal based on the data selection signal, and the input section outputs the second logic information to the first node as a high level signal when the clock signal is at the low level.

In the scan flip flop of the present invention, the input section is connected to the control section through first, second and third nodes to operate such that when the clock signal is at the low level, the input section outputs a high level signal to the first node, if the potential of the third node is at the high level when the input state transitions from the first state where the test selection signal is at the low level and the clock signal is at the low level to the second state where the test selection signal is at the low level and the clock signal is at the high level, the input section retains the potential of the first node at the high level depending on a signal structure of the data signal group input to the nMOS logic block formed in the input section and, when the potentials of the second and third nodes transition from the high level to the low level at a time after the retainment of the high level lasts for a predetermined time or longer, the input section retains the potential of the first node at the high level during the second state irrespective of the levels of the data signal and the test input signal, or the input section shifts the potential of the first node from the high level to the low level within the predetermined time and retains the potential of the first node at the low level during the second state irrespective of the levels of the predetermined data signal and the test input signal, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level within the predetermined time and retains the potential of the first node at the low level during the fourth state irrespective of the levels of the data signal and the test input signal, in the case where the test input signal is at the low level, if the potential of the third node is at the low level at the transition of the input state from the third state to the fourth state, the input section retains the potential of the first node at the high level, and when the potential of the second node transitions from the high level to the low level at a time after the lapse of the predetermined time, the input section retains the potential of the first node at the high level during the fourth state irrespective of the levels of the data signal and the test input signal; the control section operates such that in the case where the predetermined data signal is at the low level, when the input state transitions from the first state to the second state, the control section shifts the potentials of the second and third nodes from the high level to the low level at a time after the lapse of the predetermined time, and in the case where the test input signal is at the low level, when the input state transitions from the third state to the fourth state, the control section shifts the potential of the second node from the high level to the low level at a time after the lapse of the predetermined time and retains the potential of the third node at the low level; and the output section operates such that when the clock signal is at the high level, the output section outputs an inversion signal of a signal at the first node as an output signal, and when the clock signal is at the low level, the output section retains the level of a previous signal.

In the scan flip flop of the present invention, the input section is connected to the control section through first, second and third nodes to operate such that when the clock signal is at the low level, the input section outputs a high level signal to the first node, if the potential of the third node is at the high level when the input state transitions from the first state where the test selection signal is at the low level and the clock signal is at the low level to the second state where the test selection signal is at the low level and the clock signal is at the high level, the input section retains the potential of the first node at the high level or shifts the potential of the first node from the high level to the low level depending on a signal structure of the data signal group input to the nMOS logic block formed in the input section within a predetermined time, and when the potential of the second node transitions from the high level to the low level at a time after the lapse of the predetermined time, the input section retains the potential of the first node during the second state irrespective of the potentials of the data signal and the test input signal, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level within the predetermined time and retains the potential of the first node at the low level during the fourth state irrespective of the levels of the predetermined data signal and the test input signal, and in the case where the test input signal is at the low level, when the input state transitions from the third state to the fourth state, the input section retains the potential of the first node at the high level, and when the potential of the second node transitions from the high level to the low level at a time after the lapse of the predetermined time, the input section retains the potential of the first node at the high level during the fourth state irrespective of the levels of the predetermined data signal and the test input signal; and the control section operates such that in the case where the predetermined data signal is at the high level, at the transition of the input state from the first state to the second state, the control section retains the potentials of the second and third nodes at the high level according to a potential change of the first node from the high level to the low level, in the case where the predetermined data signal is at the low level, at the transition of the input state from the first state to the second state, the control section shifts the potentials of the second and third nodes from the high level to the low level according to a signal at the first node which is retained at the high level, in the case where the test input signal is at the high level, at the transition of the input state from the third state to the fourth state, the control section retains the potential of the second node at the high level and retains the potential of the third node at the low level according to a potential change of the first node from the high level to the low level, and in the case where the test input signal is at the low level, at the transition of the input state from the third state to the fourth state, the control section shifts the potential of the second node from the high level to the low level and retains the potential of the third node at the low level according to a signal at the first node which is retained at the high level; and the output section operates such that when the clock signal is at the high level, the output section outputs an inversion signal of a signal at the first node as an output signal, and when the clock signal is at the low level, the output section retains the level of a previous signal.

In the scan flip flop of the present invention, the input section and the control section is connected to each other through first, second and third nodes; the control section and the output section are connected to each other through the fourth and fifth nodes; the input section operates such that when the clock signal is at the low level, the input section outputs a high level signal to the first node, if the potential of the third node is at the high level when the input state transitions from the first state where the test selection signal is at the low level and the clock signal is at the low level to the second state where the test selection signal is at the low level and the clock signal is at the high level, the input section retains the potential of the first node at the high level or shifts the potential of the first node from the high level to the low level within a predetermined time depending on a signal structure of the data signal group input to the nMOS logic block formed in the input section, and during the second state, the input section retains the potential of the first node at the low level irrespective of the potentials of the predetermined data signal and the test input signal, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level and retains the potential of the first node at the low level during the fourth state irrespective of the potentials of the data signal and the test input signal, and in the case where the test input signal is at the low level, if the potential of the third node is at the low level at the transition of the input state from the third state to the fourth state, the input section retains the potential of the first node at the high level; the control section operates such that in the case where the predetermined data signal is at the high level, at the transition of the input state from the first state to the second state, the control section retains the potentials of the second and third nodes at the high level, retains the potential of the fourth node at the high level, and shifts the potential of the fifth node from the low level to the high level, according to a signal at the first node which transitions from the high level to the low level, in the case where the predetermined data signal is at the low level, at the transition of the input state from the first state to the second state, the control section shifts the potentials of the second and third nodes from the high level to the low level, shifts the potential of the fourth node from the high level to the low level, and retains the potential of the fifth node at the low level, according to a signal at the first node which is retained at the high level, in the case where the test input signal is at the high level, at the transition of the input state from the third state to the fourth state, the control section retains the potential of the second node at the high level and the potential of the third node at the low level, retains the potential of the fourth node at the high level, and shifts the potential of the fifth node from the low level to the high level, according to a signal at the first node which transitions from the high level to the low level, and in the case where the test input signal is at the low level, at the transition of the input state from the third state to the fourth state, the control section shifts the potential of the second node from the high level to the low level, retains the potential of the third node at the low level, shifts a signal at the fourth node from the high level to the low level, and retains the potential of the fifth node at the low level, according to a signal at the first node which is retained at the high level; and the output section operates such that when the output section receives high level signals from the fourth and fifth node, the output section outputs a high level output signal and a low level inverted output signal, when the output section receives low level signals from the fourth and fifth node, the output section outputs a low level output signal and a high level inverted output signal, and when a high level signal is received at the fourth node and a low level signal is received at the fifth node, the output section retains the levels of the output signal and the inverted output signal at previous levels.

The scan flip flop of the present invention further comprises a selection signal generation section which receives the data selection signal and outputs to the nMOS logic block a signal selected based on the data selection signal which is used for selecting the predetermined data signal among the data signal group input to the nMOS logic block.

In the scan flip flop of the present invention, the data signal group includes two data signals; the nMOS logic block includes first nMOS transistors which respectively receive the two data signals and second nMOS transistors which receive signals selected based on the data selection signal, the second nMOS transistors being connected in series to the first nMOS transistors on a one-to-one basis, the pairs of serially-connected first and second nMOS transistors being connected in parallel; and the selection signal generation section inputs the data selection signal as received and an inversion signal of the data selection signal to the second nMOS transistors in the nMOS logic block.

With the above features of the present invention, the number of transistors included in a route through which an electric current flows when the potential of the first node is changed from the high level to the low level is different between a case where a data signal is selected according to a test selection signal and a case where a test input signal is selected according to the test selection signal. With this structure, the delay time is shortened only when any one of the data signal and the test input signal is selected, whereby the operation speed is increased. When the other signal is selected, the operation speed is not increased because it is not necessary, and the circuit scale is reduced such that the number of MOS transistors is reduced. That is, the increase in the operation speed and the decrease in the circuit scale are achieved at the same time.

According to the present invention, the number of nMOS transistors included in a route through which an electric current flows when the first node is changed from the high level to the low level is smaller in a case where the data signal is selected than in a case where the test input signal is selected. With this structure, the speed of the operation carried out when the data signal is selected is faster than that of the operation carried out when the test input signal is selected in which high speed operation is not required normally, whereby the speed of the operation carried out when the data signal is selected is increased, and the number of MOS transistors is decreased.

According to the present invention, the number of nMOS transistors included in a route through which an electric current flows when the first node is changed from the high level to the low level is selected according to the test selection signal. In an embodiment of the present invention, the number of such nMOS transistors is 3 when the data signal is selected, whereas the number of such nMOS transistors is 4 when the test input signal is selected. In another embodiment of the present invention, the number of such nMOS transistors is 2 when the data signal is selected, whereas the number of such nMOS transistors is 3 when the test input signal is selected. With such a structure, the speed of the operation carried out when the data signal is selected is faster than that of the operation carried out when the test input signal is selected in which high speed operation is not required normally, whereby the speed of the operation carried out when the data signal is selected is increased, and the number of MOS transistors is decreased.

According to the present invention, in the case of forming a 2-input NOR circuit and an inverter circuit for outputting a signal to the second node, a pMOS transistor connected to the supply potential is shared by these circuits. Accordingly, the number of MOS transistors is decreased.

According to the present invention, a circuit for generating a data signal which is to be input to a scan flip flop is placed adjacent to the scan flip flop. Thus, noise which is added to the data signal is decreased, so that a semiconductor device stably operates.

According to the present invention, a semiconductor device production method includes the steps of placing a scan flip flop; placing a data signal generation circuit for generating a data signal for the scan flip flop to be adjacent to the scan flip flop; placing a circuit other than the data signal generation circuit; and forming a wire with a priority put on the data signal for the scan flip flop. Thus, noise which is added to the data signal is decreased, so that the thus-produced semiconductor device stably operates.

According to the present invention, a structure where an nMOS transistor to which one piece of data is input is replaced by an nMOS logic block to which a plurality of data signal groups are input, i.e., a structure where the number of serially-connected transistors to which the data signal is input and which are included in a current path for discharge is reduced, is employed in an input section wherein the number of serially-connected transistors to which the data signal is input is different from the number of serially-connected transistors to which the test signal is input. With this structure, a data selection signal in a data selection circuit and a test selection signal in a test selection circuit are independently input. As a result, the number of transistors included in a route through which an electric current flows when the potential of the first node is discharged from the high level to the low level is reduced, and the structure of the data selection circuit is simplified.

DESCRIPTION OF THE PREFERRED EMBODIMENTS

Hereinafter, examples of a scan flip flop (and a semiconductor device and a production method thereof) according to the present invention are described with reference to the drawings.

(Embodiment 1)

In the first place, embodiment 1 of the present invention is described.

Figure 1:
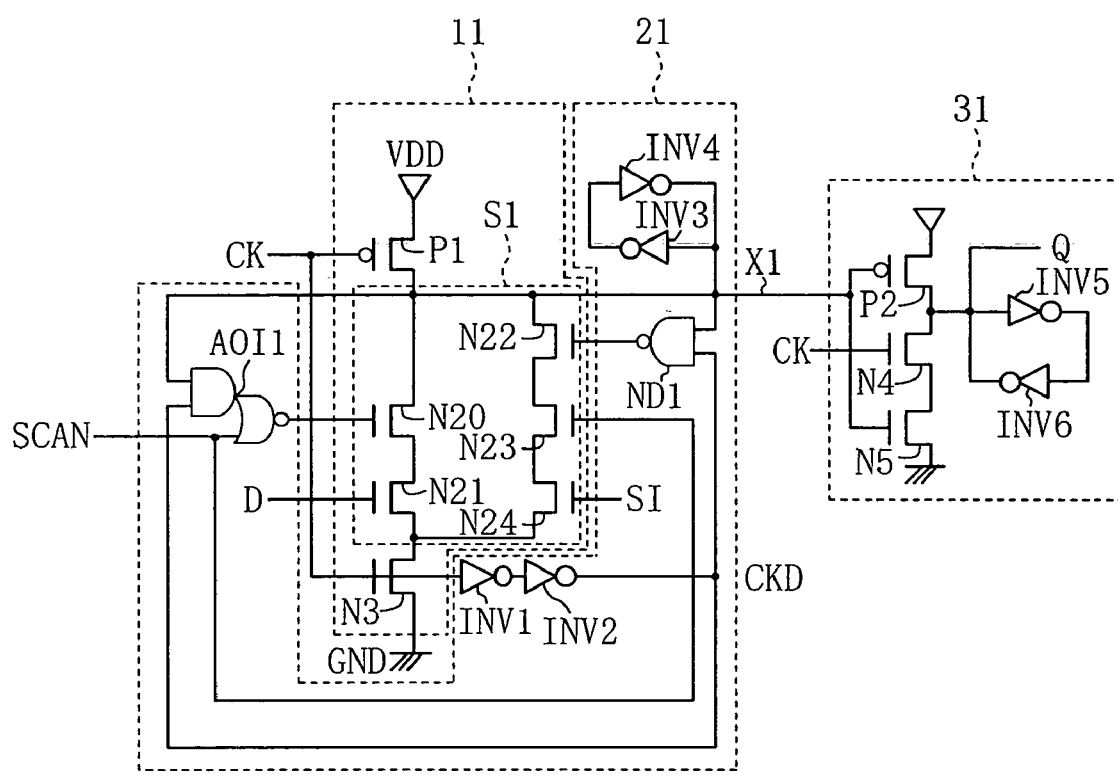
FIG. 1 shows a scan flip flop circuit according to embodiment 1 of the present invention.
Figure 2:
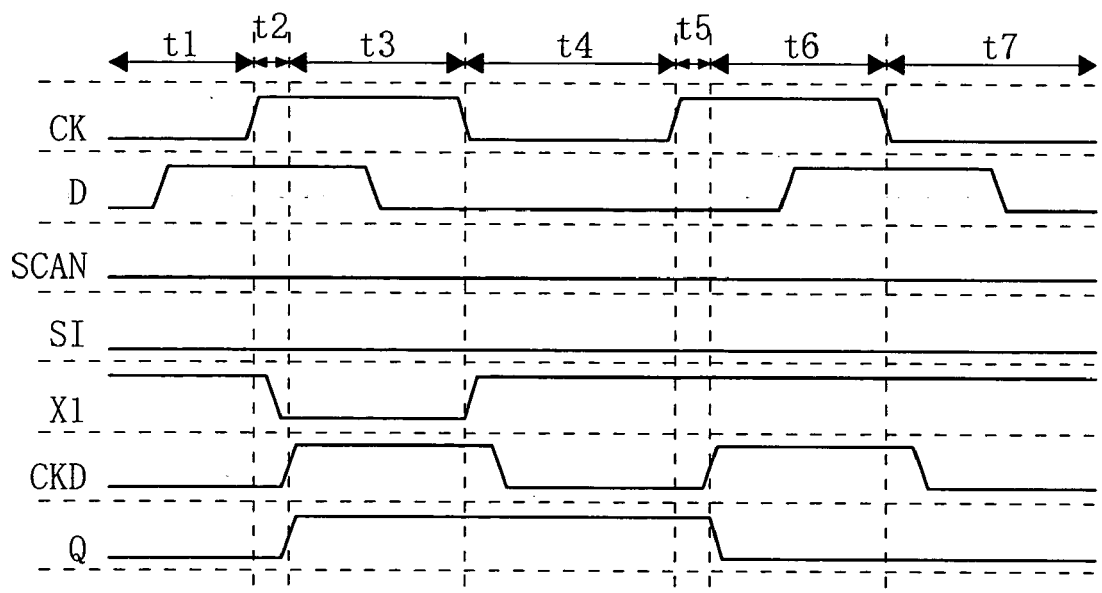
FIG. 2 is a timing chart which illustrates an operation of the scan flip flop circuit of FIG. 1.
Figure 2:
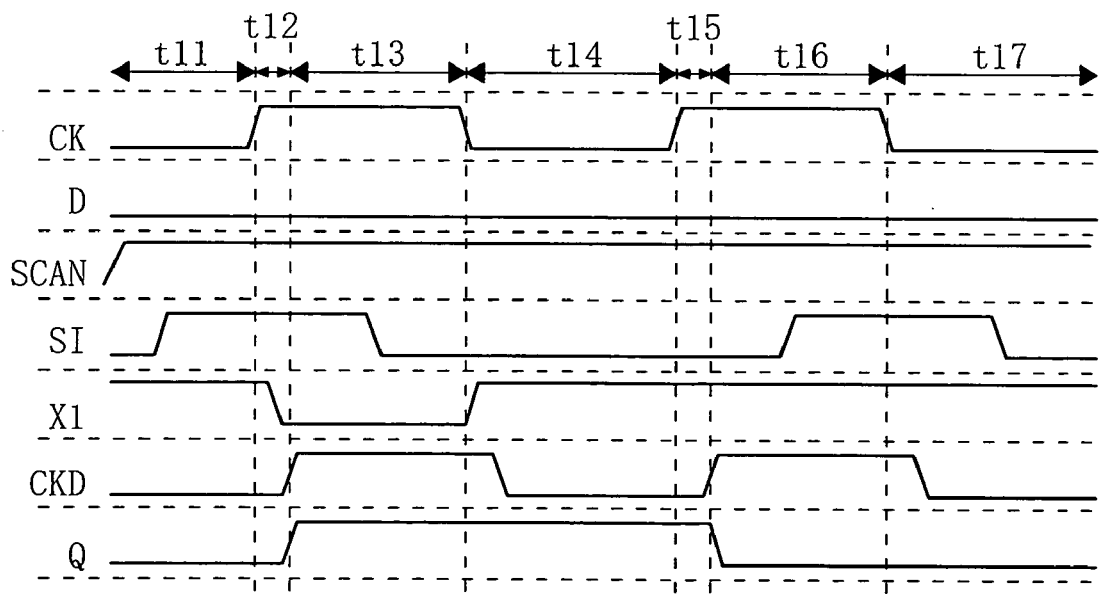

FIG. 1 is a circuit diagram showing a scan flip flop circuit according to embodiment 1 of the present invention. FIG. 2 is a timing chart which illustrates an operation of the scan flip flop circuit.

In FIG. 1, "D" denotes a data signal, "CK" denotes a clock signal, "SI" denotes a test input signal, "SCAN" denotes a test selection signal (including a data signal, a clock signal, a test input signal, first logic information of a test selection signal), "Q" denotes an output signal, "VDD" denotes a VDD power supply, and "GND" denotes a GND potential.

Reference numeral "AOI1" denotes an AND/OR inverter circuit which outputs an operation result of NOR logic of the output of a 2-input AND circuit and test selection signal SCAN. Reference numeral "ND1" denotes a 2-input NAND circuit. Reference numerals "N20" to "N24" denote nMOS transistors. A series connection of the nMOS transistors N20 and N21 and a series connection of the nMOS transistors N22, N23 and N24 are connected in parallel to constitute a selector circuit S1.

Reference numeral "P1" denotes a pMOS transistor which has a source connected to the VDD power supply. Reference numeral "N3" denotes an nMOS transistor which has a source connected to the GND potential. Clock signal CK is input to the gates of the pMOS transistor P1 and nMOS transistor N3. The selector circuit S1 is inserted between the drain of the pMOS transistor P1 and the drain of the nMOS transistor N3. Herein, a connection node between the drain of the pMOS transistor P1 and the drain of the nMOS transistor N20 is a first node X1. The node X1 is connected to a latch circuit which is formed by inverter circuits INV3 and INV4 through the output terminal of the inverter circuit INV3. With this structure, the potential of the node X1 is latched.

The AND/OR inverter circuit AOI1 has an input terminal connected to the node X1. The other input terminal of AND/OR inverter circuit AOI1 receives a signal obtained by delaying clock signal CK with inverter circuits INV1 and INV2. Herein, the output terminal of the inverter circuit INV2 and the AND/OR inverter circuit AOI1 are connected at a node CKD.

In the selector circuit S1, the gate of the nMOS transistor N20 is connected to the output terminal of the AND/OR inverter circuit AOI1. The gate of the nMOS transistor N23 receives test selection signal SCAN. The gate of the nMOS transistor N21 receives data signal D. The gate of the nMOS transistor N24 receives test input signal SI. With this structure, the AND/OR inverter circuit AOI1 functions as an inverter circuit for test selection signal SCAN except for a case where the two signals input to the AND circuit of the AND/OR inverter circuit AOI1 are both at the high level. Therefore, when test selection signal SCAN is at the high level, the nMOS transistor N20 is off, and the nMOS transistor N23 is on, so that the selector circuit S1 works on data signal D. As a result, the route of an electric current from the node X1 through the nMOS transistors N20, N21 and N23 to the GND potential is cut off. When test selection signal SCAN is at the low level, the nMOS transistor N20 is on, and the nMOS transistor N23 is off, so that the selector circuit S1 works on test input signal SI. As a result, the route of an electric current from the node X1 through the nMOS transistors N22, N23, N24 and N3 to the GND potential is cut off. When the two signals input to the AND circuit of the AND/OR inverter circuit AOI1 are both at the high level, the output signal of the AND/OR inverter circuit AOI1 is always at the low level irrespective of the value of test selection signal SCAN, so that the nMOS transistor N20 is cut off. The gate of the nMOS transistor N22 of the selector circuit S1 is connected to the output terminal of the 2-input NAND circuit ND1. With this structure, when the two input signals of the NAND circuit ND1 are both at the high level, the NAND circuit ND1 outputs a low level signal to turn off the nMOS transistor N22. In the case of any other combination of the two input signals of the NAND circuit ND1, the NAND circuit ND1 outputs a high level signal to turn on the nMOS transistor N22. As described above, the operation of an input section 11, which includes the pMOS transistor P1 and 6 nMOS transistors N20 to N24 and N3, is controlled by a control section 21 including the AND/OR inverter circuit AOI1, the inverter circuits INV1 and INV2, which constitute the delay circuit, the inverter circuits INV3 and INV4, which constitute the latch circuit, and the NAND circuit ND1.

The node X1 is further connected to the gate of a pMOS transistor P2, which has a source connected to the VDD power supply, and the gate of an nMOS transistor N5, which has a source connected to the GND potential. An nMOS transistor N4 is inserted in series between the pMOS transistor P2 and the nMOS transistor N5. The gate of the nMOS transistor N4 receives clock signal CK. Herein, the potential obtained from a connection node of the pMOS transistor P2 and the nMOS transistor N4 is output signal Q of the flip flop circuit. Output signal Q is latched by a latch circuit which is formed by inverter circuits INV5 and INV6 and is connected to the drain of the pMOS transistor P2. With this structure, when clock signal CK is at the high level, the nMOS transistor N4 is turned on, so that the pMOS transistor P2 and the nMOS transistor N5 functions as a CMOS inverter which outputs output signal Q obtained by inverting the potential of the node X1 (second logic information). When clock signal CK is at the low level, the nMOS transistor N4 is turned off. If the potential of the node X1 is at the high level, the previous value of output signal Q is latched by the latch circuit which is formed by the inverter circuits INV5 and INV6. If the potential of the node X1 is at the low level, the pMOS transistor P2 is turned on so that output signal Q rises to the high level. Thus, an output section 31, which includes the pMOS transistor P2, the nMOS transistors N4 and N5, and the inverter circuits INV5 and INV6, outputs signal Q based on the node X1.

Next, an operation of the scan flip flop circuit having the above structure is described with reference to the timing chart of FIG. 2.

In the first place, the operation carried out when test selection signal SCAN is at the low level and output signal Q is determined depending on data signal D (intervals t1 to t7 in FIG. 2) is described.

During the time when clock signal CK is at the low level (corresponding to intervals t1, t4 and t7 of FIG. 2: first state), the pMOS transistor P1 is turned on so that the node X1 is at the high level. Accordingly, the nMOS transistor N4 and the pMOS transistor P2 are turned off, and therefore, the potential of output signal Q is retained unchanged at the previous value.

When clock signal CK transitions to the high level, the node CKD does not immediately transition to the high level. The transition of the node CKD to the high level is delayed by the inverter circuits INV1 and INV2. During the time when clock signal CK is at the high level and the node CKD is at the low level (corresponding to intervals t2 and t5 of FIG. 2: initial state of second state: hereinafter, referred to as "evaluation period"), the output of the AND/OR inverter circuit AOI1 is at the high level, and the nMOS transistor N20 is in the on state. If data signal D is at the high level during this period, the potential of the node X1 changes from the high level to the low level through the nMOS transistors N20, N21 and N3. With this structure, the pMOS transistor P2 is turned on, and output signal Q transitions to the high level. On the other hand, if data signal D is at the low level during the evaluation period (predetermined period), the node X1 remains at the high level, and output signal Q transitions to the low level by means of the nMOS transistors N4 and N5.

Then, the state where clock signal CK is at the high level and the node CKD is at the high level (corresponding to intervals t3 and t6 of FIG. 2: the state which is reached when a predetermined time has passed after transition to the second state: hereinafter, referred to as "retainment period") is entered. If the node X1 is at the high level at this timing, the nMOS transistor N20 is cut off by the AND/OR inverter circuit AOI1. Thus, the high level state is latched by the latch circuit which is formed by the inverter circuits INV3 and INV4 without being influenced by the value of data signal D. In the case where the node X1 is at the low level and the retainment period is entered, the pMOS transistor P1 is cut off, and therefore, the potential of the node X1 is latched at the low level by the latch circuit which is formed by the inverter circuits INV3 and INV4 irrespective of the value of data signal D.

Then, the operation carried out when test selection signal SCAN is at the high level, i.e., test input signal SI is selected (corresponding to intervals t11 to t17 of FIG. 2), is described.

During the time when clock signal CK is at the low level (corresponding to intervals t11, t14 and t17 of FIG. 2: third state), the node X1 is raised to the high level by the pMOS transistor P1. Accordingly, the nMOS transistor N4 and the pMOS transistor P2 are turned off, and therefore, output signal Q is retained unchanged at the previous value. Then, during the evaluation period (corresponding to intervals t12 and t15 of FIG. 2: within a predetermined time after transition to the fourth state), the node CKD is at the low level. Accordingly, the output of the NAND circuit ND1 rises to the high level so that the nMOS transistor N22 is turned on. If test input signal SI is at the high level during this period, the node X1 transitions from the high level to the low level, and output signal Q is raised to the high level by the pMOS transistor P2. If test input signal SI is at the low level during the evaluation period, the node X1 remains at the high level, and the output signal is raised to the low level by the nMOS transistors N4 and N5 which are in the ON state. Then, the retainment period (corresponding to intervals t13 and t16 of FIG. 2: the state which is reached when a predetermined time has passed after transition to the fourth state) is entered. If the node X1 is at the high level, two inputs of the NAND circuit ND1 are both at the high level. Therefore, the nMOS transistor N22 is cut off. Thus, the potential of the node X1 is latched at the high level by the latch circuit which is formed by the inverter circuits INV3 and INV4 without being influenced by the value of test input signal SI. In the case where the node X1 is at the low level and the retainment period is entered, the pMOS transistor P1 is cut off, and therefore, the potential of the node X1 is latched at the low level by the latch circuit which is formed by the inverter circuits INV3 and INV4 irrespective of the value of test input signal SI.

In general, an inverter circuit is formed by 2 MOS transistors, a 2-input NAND circuit is formed by 4 MOS transistors, and an AND/OR inverter circuit is formed by 6 MOS transistors. Thus, the flip flop of FIG. 1 is formed by 32 MOS transistors in total.

Figure 11:
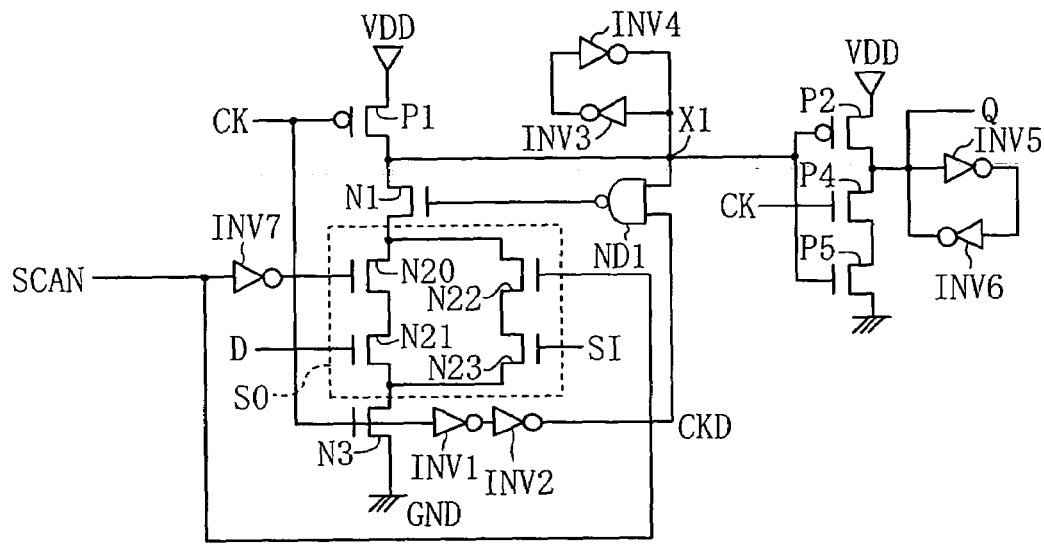
FIG. 11 shows a scan flip flop circuit of conventional example 1.
Figure 12:
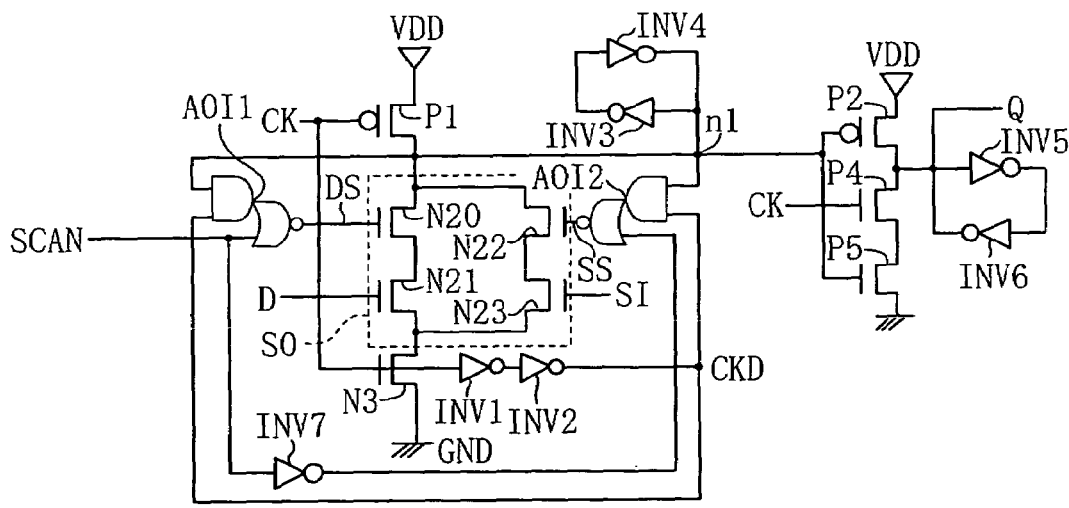
FIG. 12 shows a scan flip flop circuit of conventional example 2.

As described above, according to embodiment 1, 4 additional MOS transistors are used as compared with the circuit of conventional example 1 of FIG. 11, but the number of serially-connected nMOS transistors to which a data signal is applied is decreased from 4 to 3, whereby the operation speed in the normal operation is improved. In the test operation which does not require high speed operation as compared with the normal operation, the number of serially-connected nMOS transistors to which a data signal is applied is set to 4. Therefore, the number of MOS transistors is decreased from 35 to 32 as compared with the circuit of conventional example 2 of FIG. 12. Thus, an increase in the speed of the normal operation and a reduction in the circuit area are achieved at the same time.

(Embodiment 2)

Hereinafter, a scan flip flop according to embodiment 2 of the present invention is described with reference to the drawings.

Figure 3:
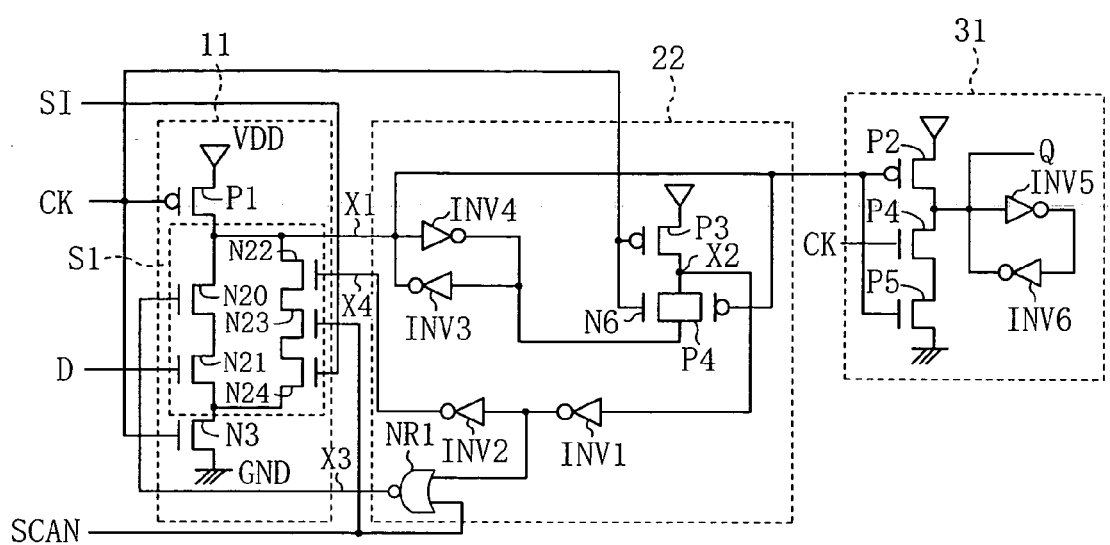
FIG. 3 shows a scan flip flop circuit according to embodiment 2 of the present invention.
Figure 4:
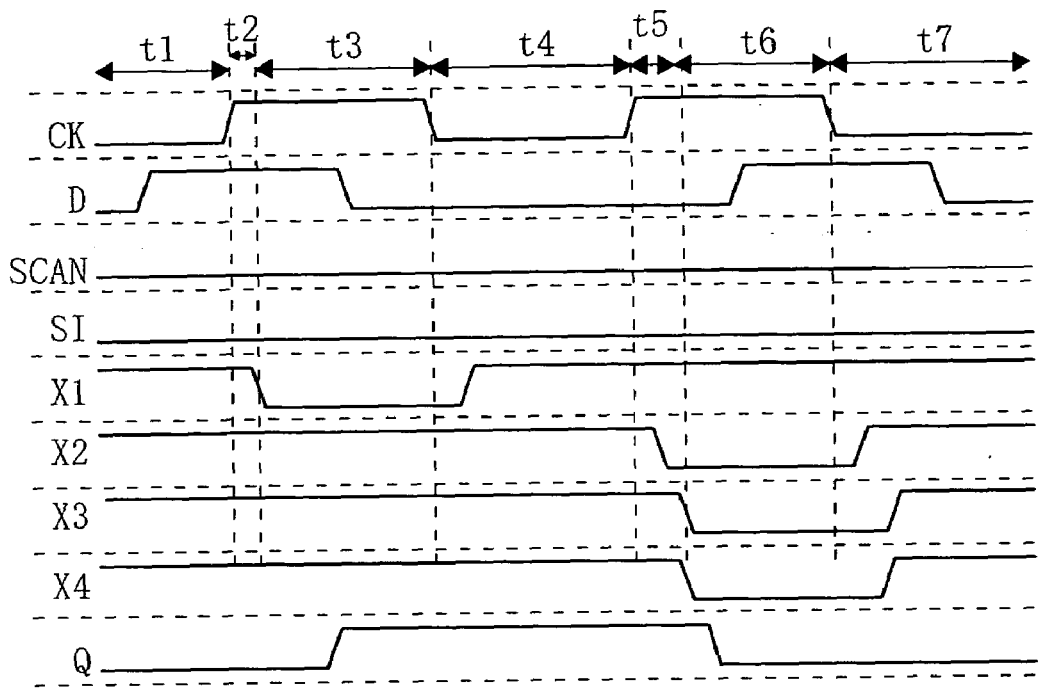
FIG. 4 is a timing chart which illustrates an operation of the scan flip flop circuit of FIG. 3.
Figure 4:
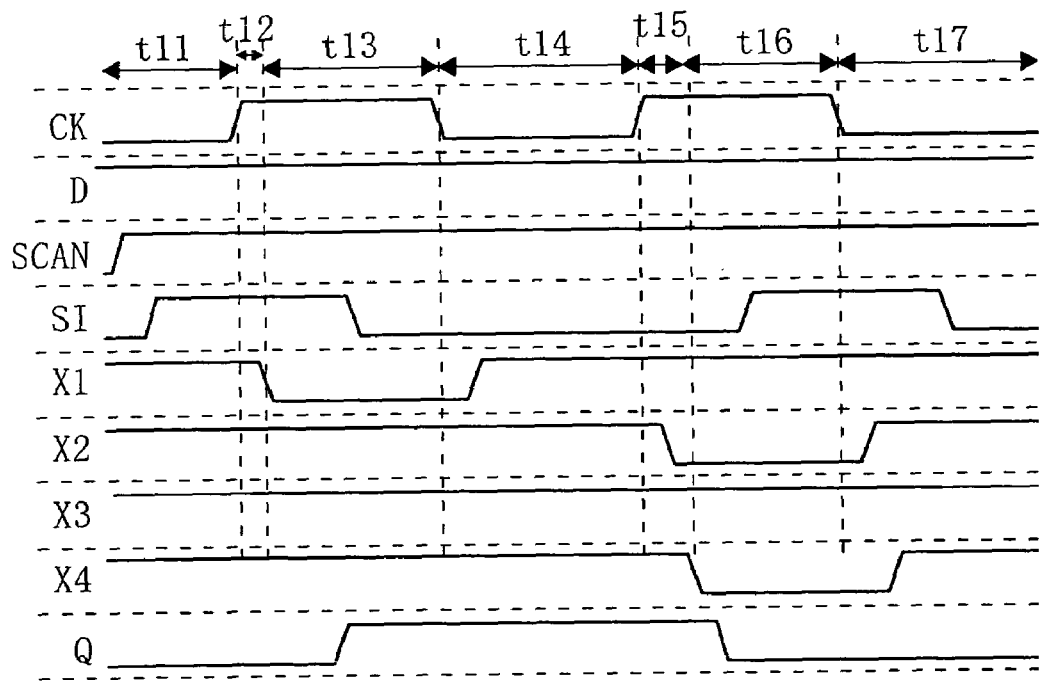

FIG. 3 is a circuit diagram showing a scan flip flop circuit according to embodiment 2. FIG. 4 is a timing chart which illustrates an operation of the scan flip flop circuit.

In the scan flip flop shown in FIG. 3, the input section 11 at the input side (including the pMOS transistor P1 and the nMOS transistors N20 to N24 and N3) and the output section 31 at the output side (including the pMOS transistor P2, the nMOS transistors N4 and N5, and the inverter circuits INV5 and INV6) have the same structures as shown in FIG. 1 in embodiment 1, and therefore, the descriptions thereof are omitted.

In embodiment 2, in the selector circuit S1 formed by the five nMOS transistors N20 to N24, a control section 22 for generating control signals which are input to the gate of the nMOS transistor N20 (third node X3 in FIG. 3) and the gate of the nMOS transistor N22 (second node X4 in FIG. 3) is different from the control section 21 of embodiment 1. The structure of the control section 22 is described below.

The transistors N6 and P4 are an nMOS transistor and a pMOS transistor which constitute a transmission gate. The transmission gate is connected in series to a pMOS transistor P3 at the fourth node X2. The source of the pMOS transistor P3 is connected to the VDD power supply. Herein, clock signal CK is input to the gate of the pMOS transistor P3 and the gate of the nMOS transistor N6. The gate of the pMOS transistor P4 is connected to the first node X1.

The inverter circuits INV3 and INV4 constitute a latch circuit as in embodiment 1. The output side of the inverter circuit INV4 is connected to the source of the nMOS transistor which constitutes the transmission gate. The input side of the inverter circuit INV4 is connected to the node X1. With this structure, the latch circuit formed by the inverter circuits INV3 and INV4 latches the potential of the node X1 and transfers the inverted potential of the node X1 to the source of the nMOS transistor N6.

The node X2 is connected to the input terminal of the inverter circuit INV1 and is further connected to the gate of the nMOS transistor N22 of the input section 11 through the inverter circuit INV2 which is connected in series to the inverter circuit INV1. A connection node (sixth node) of the output terminal of the inverter circuit INV1 and the input terminal of the inverter circuit INV2 is connected to one of the input terminals of a 2-input NOR circuit NR1. The other input terminal of the NOR circuit NR1 receives test selection signal SCAN. The output terminal of the NOR circuit NR1 is connected to the gate of the nMOS transistor N20.

Also in embodiment 2, data signal D is input to the gate of the nMOS transistor N21, test selection signal SCAN is input to the gate of the nMOS transistor N23, and test input signal SI is input to the gate of the nMOS transistor N24 as in embodiment 1.

With the above structure, when test selection signal SCAN is at the low level, the nMOS transistor N23 is off, and the route of an electric current from the node X1 through the nMOS transistors N22, N23, N24 and N3 to the GND potential is cut off. Herein, if clock signal CK is at the high level and the output of the NOR circuit NR1 is at the high level, the value of the node X1 is determined according to the value of data signal D. Thus, output signal Q is determined depending on data signal D. When test selection signal SCAN is at the high level, the output of the NOR circuit NR1 is at the low level. Thus, the nMOS transistor N20 is off, and the route of an electric current from the node X1 through the nMOS transistors N20, N21 and N3 to the GND potential is cut off. Herein, when clock signal CK is at the high level and the output of the node X4 is at the high level, the value of the potential of the node X1 is determined according to test input signal SI. Thus, output signal Q is also determined depending on test input signal SI.

Hereinafter, an operation of the scan flip flop of embodiment 2 is described with reference to FIGS. 3 and 4.

In the first place, the operation carried out when test selection signal SCAN is at the low level and output signal Q is determined depending on data signal D (intervals t1 to t7 in FIG. 4) is described.

During the time when clock signal CK is at the low level (corresponding to intervals t1, t4 and t7 of FIG. 4: first state), the potential of the node X1 is raised to the high level by the pMOS transistor P1, and the potential of the node X2 is raised to the high level by the pMOS transistor P3. In this case, the nMOS transistor N4 and the pMOS transistor P2 are cut off, and therefore, output signal Q is retained unchanged at the previous value.

During the time when clock signal CK is at the high level and the node X3 is at the high level (corresponding to intervals t2 and t5 of FIG. 4: within a predetermined period after transition to the second state), the nMOS transistors N20 and N3 are in the on state. If data signal D is at the high level during this period, the potential of the node X1 transitions from the high level to the low level. Accordingly, the output of the inverter circuit INV4 transitions from the low level to the high level. Thus, the potentials of the nodes X2 and X3 are retained at the high level (corresponding to interval t3 of FIG. 4: the state which is reached when a predetermined time has passed after transition to the second state). In this case, the node X1 is at the low level. Therefore, the pMOS transistor P2 is turned on, and output signal Q transitions to the high level. If data terminal D is at the low level, the node X1 remains at the high level, the output of the inverter circuit INV4 also remains at the low level, and the nMOS transistors N6 is on. Thus, the node X3 transitions to the low level. Under such conditions, when the nMOS transistors N4 and N5 are turned on, output signal Q transitions to the low level.

When clock signal CK is at the high level and the node X3 transitions to the high level state (corresponding to interval t6 of FIG. 4: the state which is reached when a predetermined time has passed after transition to the second state), the nMOS transistor N20 is cut off. Therefore, the level of the node X1 is latched by the latch circuit which is formed by the inverter circuits INV3 and INV4 irrespective of the value of data signal D. When clock signal CK is at the high level and the node X1 is at the low level, the pMOS transistor P1 is cut off. Thus, the node X1 is latched at the low level by the latch circuit which is formed by the inverter circuits INV3 and INV4 irrespective of the value of data signal D.

Then, the operation carried out when test selection signal SCAN is at the high level and output signal Q is determined depending on test input signal SI is selected (corresponding to intervals t11 to t17 of FIG. 4), is described.

During the time when clock signal CK is at the low level (corresponding to intervals t11, t14 and t17 of FIG. 4: third state), the potential of the node X1 rises to the high level when the pMOS transistor P1 is turned on, and the potential of the node X2 rises to the high level when the pMOS transistor P3 is turned on. Accordingly, the nMOS transistor N4 and the pMOS transistor P2 are cut off, and therefore, output signal Q is retained unchanged at the previous value.

During the time period when clock signal CK is at the high level and the potential of the node X4 is at the high level (corresponding to intervals t12 and t15 of FIG. 4: within a predetermined time after transition to the fourth state), the nMOS transistor N22 is in the ON state. Therefore, if test input signal SI is at the high level during this period, the potential of the node X1 transitions from the high level to the low level. Accordingly, the output of the inverter circuit INV4 transitions from the low level to the high level. Thus, the potentials of the nodes X2 and X3 are retained at the high level (corresponding to interval t13 of FIG. 4: the state which is reached when a predetermined time has passed after transition to the fourth state). In this case, the pMOS transistor P2 is turned on, and therefore, output signal Q transitions to the high level. If data terminal D is at the low level, the potential of the node X1 remains at the high level, the output of the inverter circuit INV4 remains at the low level, and the nMOS transistors N6 is in the ON state. Thus, the node X2 transitions to the low level. The node X4, which is the output of the inverter circuit INV2, transitions to the low level. Under such conditions, output signal Q is lowered to the low level by the nMOS transistors N4 and N5.

The state where clock signal CK is at the high level and the node X4 is at the low level (corresponding to interval t16 of FIG. 4: the state which is reached when a predetermined time has passed after transition to the fourth state) is entered, the nMOS transistor N22 is cut off. Therefore, the level of the node X1 is retained by the inverter circuits INV3 and INV4 without being influenced by the value of test input signal SI. In the case where clock signal CK is at the high level and the potential of the node X1 is at the low level, the pMOS transistor P1 is cut off, and therefore, the potential of the node X1 is retained at the low level by the inverter circuits INV3 and INV4 irrespective of the value of test input signal SI.

In general, an inverter circuit is formed by 2 MOS transistors, and a 2-input NOR circuit is formed by 4 MOS transistors. Thus, the scan flip flop of embodiment 2 shown in FIG. 3 is formed by 29 MOS transistors in total.

As described above, according to embodiment 2, one additional MOS transistors is used as compared with the circuit of conventional example 1 of FIG. 11, but the number of serially-connected nMOS transistors to which data signal D is applied is decreased from 4 to 3, whereby the operation speed in the normal operation is improved. In the test operation which does not require high speed operation as compared with the normal operation, the number of serially-connected nMOS transistors to which test input signal SI is applied is set to 4. Therefore, the number of MOS transistors is decreased from 35 to 29, i.e., by 6, as compared with the circuit of conventional example 2 of FIG. 12. Thus, an increase in the speed of the normal operation and a reduction in the circuit area are achieved at the same time.

(Embodiment 3)

Figure 5:
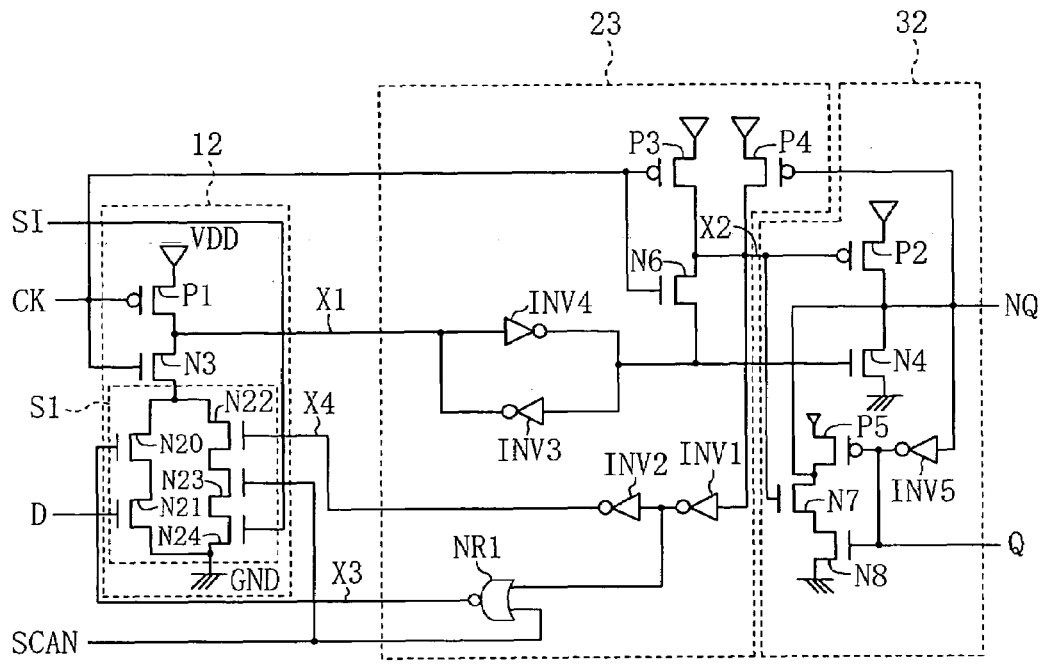
FIG. 5 shows a scan flip flop circuit according to embodiment 3 of the present invention.
Figure 7:
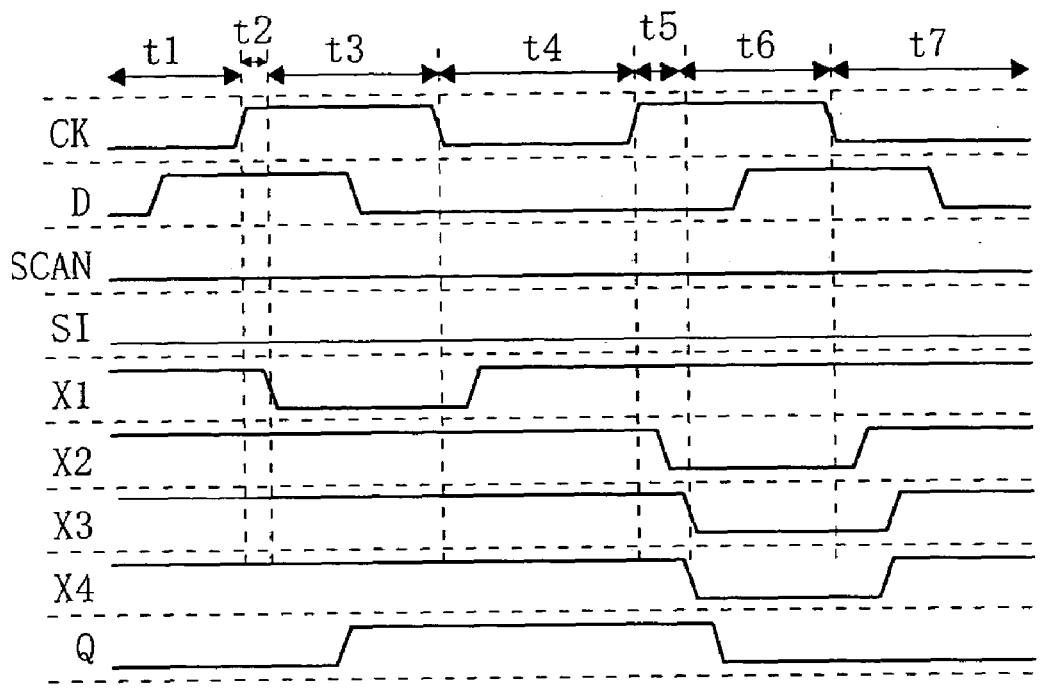
FIG. 7 is a timing chart which illustrates an operation of the scan flip flop circuit of FIG. 5.
Figure 7:
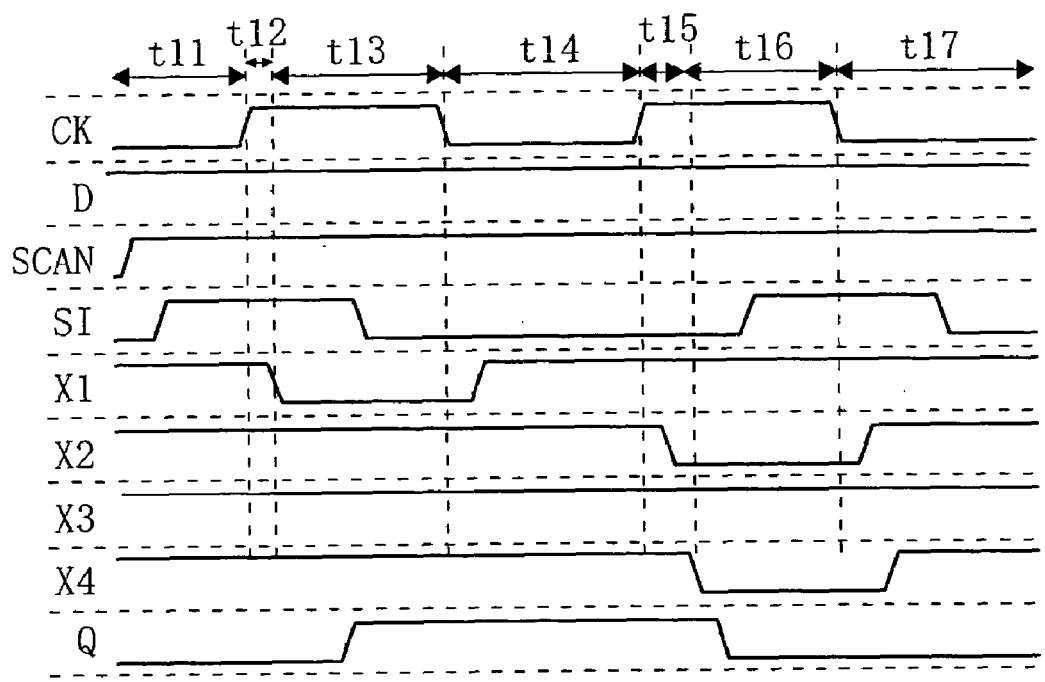

FIG. 5 is a circuit diagram showing a scan flip flop according to embodiment 3. FIG. 7 is a timing chart which illustrates an operation of the scan flip flop. It should be noted that, in embodiment 3, the same circuit components as those shown in the circuit diagrams of FIGS. 1 and 3 in embodiments 1 and 2 are denoted by the same reference numerals, and the descriptions thereof are omitted.

In embodiment 3, an input section 12, which includes the pMOS transistor P1, nMOS transistors N3, N20 to N24, is different from the input section 11 of embodiment 2 in that a selector circuit S1 formed by the nMOS transistors N20 to N24 is connected between the nMOS transistor N3 and the GND potential.

In the structure of FIG. 3 (embodiment 2), the nMOS transistor N6 and the pMOS transistor P4 are connected in series to the pMOS transistor P3 to constitute a transmission gate. However, in FIG. 5 of embodiment 3, only the nMOS transistor N6 is connected in series to the pMOS transistor P3 to form a CMOS inverter structure where the value of clock signal CK is inverted and output to the fourth node X2. The source and drain of the pMOS transistor P4 are connected to the VDD power supply and the node X2, respectively, to form a control section 23.

In FIGS. 1 and 3, the circuit of the output section 31 is formed by the pMOS transistor P2, the nMOS transistors N4 and N5, and the inverter circuits INV5 and INV6. However, in FIG. 5 of embodiment 3, an output section 32 is formed by the series connection of the pMOS transistor P2 having a source connected to the VDD power supply and the nMOS transistor N4 having a source connected to the GND potential, the series connection of a pMOS transistor P5 having a source connected to the VDD power supply, an nMOS transistor N8 having a source connected to the GND potential, and an nMOS transistor N8 inserted therebetween, and the inverter circuit INV5. Herein, the gates of the pMOS transistor P2 and the nMOS transistor N7 are connected to the node X2. The gates of the pMOS transistor P5 and the nMOS transistor N8 are connected to an output terminal Q. A connection node of the pMOS transistor P2 and the nMOS transistor N4 is connected to the gate of the pMOS transistor P4, the input terminal of the inverter circuit INV5, a connection node of the pMOS transistor P5 and the nMOS transistor N7, and an inverted output signal terminal NQ from which an inverted output signal is output. The output terminal of the inverter circuit INV5 is connected to the gate of the pMOS transistor P5, i.e., the output signal terminal Q. The output section 32 of embodiment 3 has the above structure.

In the above structure, when test selection signal SCAN is at the low level, the nMOS transistor N23 is off, and the route of an electric current from the node X1 through the nMOS transistors N3, N22, N23 and N24 to the ground GND is cut off. Herein, if clock signal CK is at the high level and the node X3, which is the output of the NOR circuit NR1, is at the high level, the value of the node X1 is determined according to the value of data signal D. Thus, output signal Q and inverted output signal NQ are determined depending on data signal D. When test selection signal SCAN is at the high level, the NOR circuit NR1 outputs a low level signal to the node X3. Thus, the nMOS transistor N20 is turned off, and the route of an electric current from the node X1 through the nMOS transistors N20, N21 and N3 to the ground GND is cut off. Therefore, when clock signal CK is at the high level and the potential of the node X4 is at the high level, the value of the node X1 is determined according to test input signal SI. Thus, output signal Q and inverted output signal NQ are also determined depending on test input signal SI.

Figure 6:
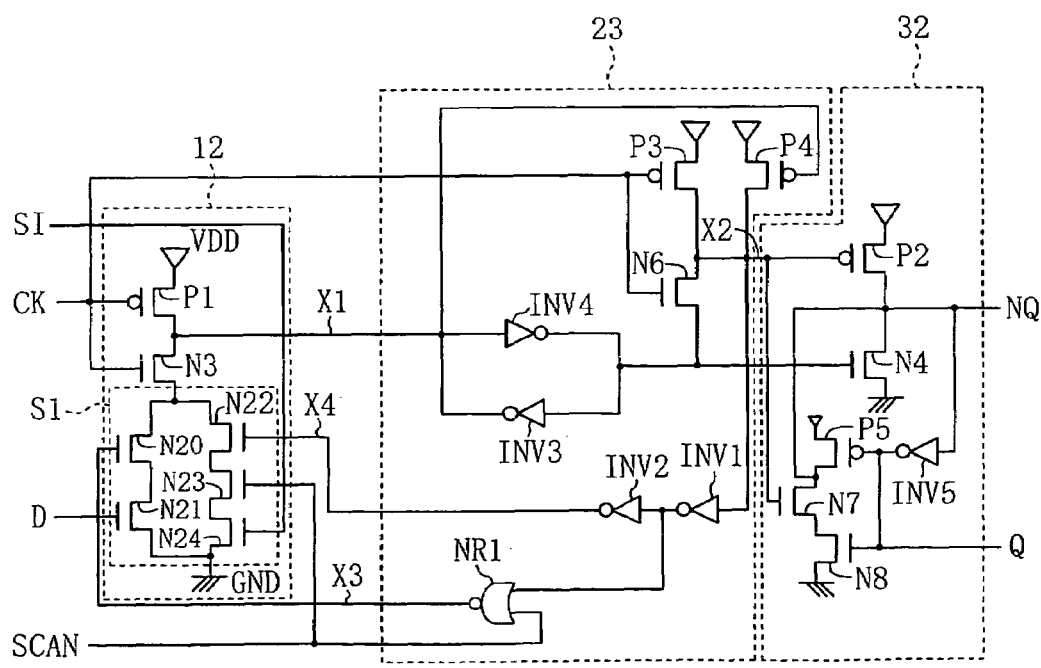
FIG. 6 shows another example of a scan flip flop circuit according to embodiment 3 of the present invention.

Hereinafter, a scan flip flop of embodiment 3 is described with reference to FIGS. 5 and 6.

In the first place, the operation carried out when test selection signal SCAN is at the low level and output signal Q is determined depending on data signal D (intervals t1 to t7 in FIG. 7) is described.

During the time when clock signal CK is at the low level (corresponding to intervals t1, t4 and t7 of FIG. 7: first state), the potential of the node X1 is raised to the high level by the pMOS transistor P1, and the potential of the node X2 is raised to the high level by the pMOS transistor P3. In this case, the nMOS transistor N4 and the pMOS transistor P2 are cut off, and therefore, output signal Q is retained unchanged at the previous value by the inverter circuit INV5, the pMOS transistor P5, and the nMOS transistors N7 and N8.

During the time when clock signal CK is at the high level and the node X3 is at the high level (corresponding to intervals t2 and t5 of FIG. 7: within a predetermined period after transition to the second state), the nMOS transistor N20 is in the on state. If data signal D is at the high level during this period, the node X1 transitions from the high level to the low level. Accordingly, the output of the inverter circuit INV4 (fifth node) transitions from the low level to the high level. Thus, the nodes X2 and X3 are retained at the high level (corresponding to interval t3 of FIG. 7: the state which is reached when a predetermined time has passed after transition to the second state). In this case, the nMOS transistor N4 is turned on so that inverted output signal NQ transitions to the low level, and output signal Q transitions to the high level. If data terminal D is at the low level, the node X1 remains at the high level, the output of the inverter circuit INV4 also remains at the low level, and the nMOS transistors N6 is on. Thus, the node X2 transitions from the high level to the low level. The node X3, which is the output of the NOR circuit NR1, transitions to the low level. In the meantime, the pMOS transistor P2 is turned on so that inverted output signal NQ transitions to the high level, and output signal Q transitions to the low level.

When clock signal CK is at the high level and the node X3 is in the low level state (corresponding to interval t6 of FIG. 7: the state which is reached when a predetermined time has passed after transition to the second state), the nMOS transistor N20 is cut off. Therefore, the level of the node X1 is retained by the inverter circuits INV3 and INV4 without being influenced by the value of data signal D. When clock signal CK is at the high level and the node X1 is at the low level, the pMOS transistor P1 is cut off. Thus, the node X1 is retained at the low level by the inverter circuits INV3 and INV4 irrespective of the value of data signal D.

Then, the operation carried out when test selection signal SCAN is at the high level and output signal Q is determined depending on test input signal SI is selected (corresponding to intervals t11 to t17 of FIG. 6), is described.

During the time when clock signal CK is at the low level (corresponding to intervals t11, t14 and t17 of FIG. 7: third state), the node X1 is raised to the high level by the pMOS transistor P1, and the node X2 is raised to the high level by the pMOS transistor P3. Accordingly, the nMOS transistor N4 and the pMOS transistor P2 are cut off, and therefore, inverted output signal NQ and output signal Q are retained unchanged at the previous values by the inverter circuit INV5, the pMOS transistor P5, and the nMOS transistors N7 and N8.

During the time period when clock signal CK is at the high level and the node X4 is at the high level (corresponding to intervals t12 and t15 of FIG. 7: within a predetermined time after transition to the fourth state), the nMOS transistor N22 is in the ON state. Therefore, if test input signal SI is at the high level during this period, the node X1 transitions from the high level to the low level. Accordingly, the output of the inverter circuit INV4 transitions from the low level to the high level. Thus, the nodes X2 and X3 are retained at the high level (corresponding to interval t13 of FIG. 7: the state which is reached when a predetermined time has passed after transition to the fourth state). In this case, the nMOS transistor N4 is turned on so that inverted output signal NQ transitions to the low level, and output signal Q transitions to the high level. If data terminal D is at the low level, the node X1 remains at the high level, the output of the inverter circuit INV4 remains at the low level, and the nMOS transistors N6 is on. Thus, the node X2 transitions from the high level to the low level. The node X4, which is the output of the inverter circuit INV2, transitions to the low level. Under such conditions, the pMOS transistor P2 is turned on so that inverted output signal NQ transitions to the high level, and output signal Q transitions to the low level.

The state where clock signal CK is at the high level and the node X4 is at the low level (corresponding to interval t16 of FIG. 7: the state which is reached when a predetermined time has passed after transition to the fourth state) is entered, the nMOS transistor N22 is cut off. Therefore, the level of the node X1 is retained by the inverter circuits INV3 and INV4 without being influenced by the value of test input signal SI. In the case where clock signal CK is at the high level and the node X1 is at the low level, the pMOS transistor P1 is cut off, and therefore, the potential of the node X1 is retained at the low level by the inverter circuits INV3 and INV4 irrespective of the value of test input signal SI.

In general, an inverter circuit is formed by 2 MOS transistors, and a 2-input NOR circuit is formed by 4 MOS transistors. Thus, the scan flip flop of embodiment 3 shown in FIG. 5 is formed by 29 MOS transistors in total.

As described above, according to embodiment 3, one additional MOS transistors is used as compared with the circuit of conventional example 1 of FIG. 11, but the number of serially-connected nMOS transistors to which data signal D is applied is decreased from 4 to 3, whereby the operation speed in the normal operation is improved. In the test operation which does not require high speed operation as compared with the normal operation, the number of serially-connected nMOS transistors to which test input signal SI is applied is set to 4. Therefore, the number of MOS transistors is decreased from 35 to 29, i.e., by 6, as compared with the circuit of conventional example 2 of FIG. 12. Thus, an increase in the speed of the normal operation and a reduction in the circuit area are achieved at the same time.

It should be noted that the nMOS transistor N3 to which clock signal CK is input is placed near the node X1 but may be placed near the ground GND. In the case where the current drivability of the nMOS transistor N8 is set to be about a ⅕ of that of the pMOS transistor P3 or smaller, the nMOS transistor N7 can be omitted. In such a case, the scan flip flop is formed by 28 MOS transistors in total.

In the example of FIG. 5, the gate of the pMOS transistor P4 is connected to the inverted output signal terminal NQ. However, the gate of the pMOS transistor P4 may be connected to the node X1 as shown in FIG. 6.

(Embodiment 4)

Figure 8:
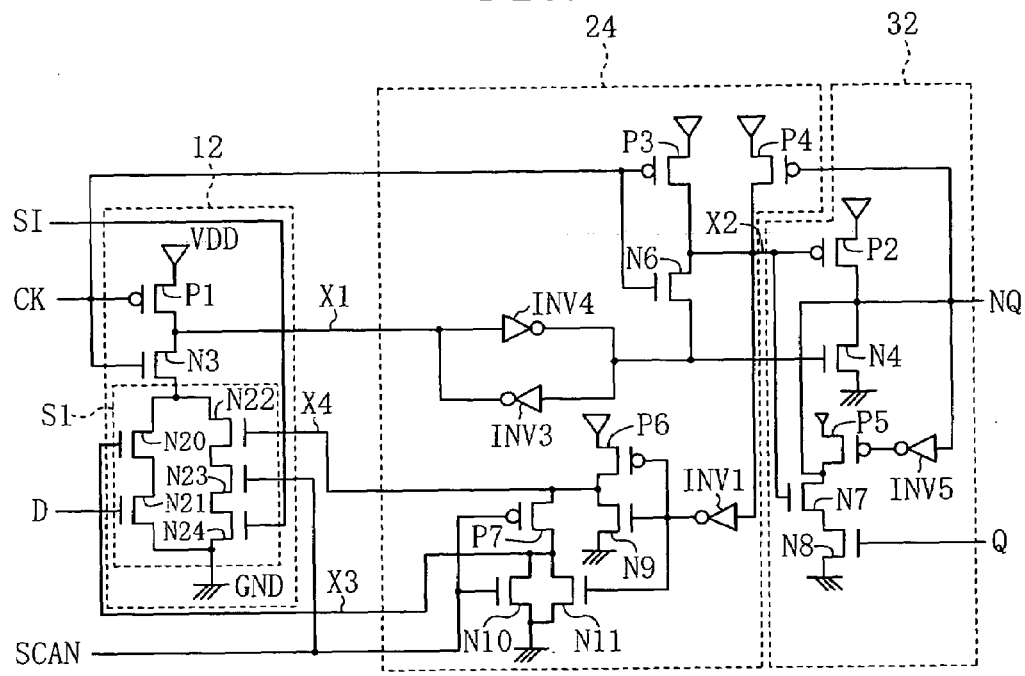
FIG. 8 shows a scan flip flop circuit according to embodiment 4 of the present invention.

FIG. 8 is a circuit diagram showing a scan flip flop according to embodiment 4. It should be noted that, in embodiment 4, the same circuit components as those shown in the circuit diagrams of FIGS. 1, 3 and 5 in embodiments 1 to 3 are denoted by the same reference numerals, and the descriptions thereof are omitted.

In embodiment 4, the inverter circuit INV2 of embodiment 3 is replaced by a CMOS inverter circuit which is formed by a pMOS transistor P6 and an nMOS transistor N9. Further, in embodiment 4, the NOR circuit NR1 of embodiment 3 is replaced by a structure where parallelly-connected nMOS transistors N10 and N11 are connected in series to a pMOS transistor P7 whose source is connected to the node X4, and the pMOS transistor P6 of the inverter circuit INV2 is commonly employed as a pMOS transistor further connected in series. Test selection signal SCAN is input to the gate of the pMOS transistor P7 and the gate of the nMOS transistor N10. The gate of the pMOS transistor P6 is connected to the gate of the nMOS transistor N11. The drain of the pMOS transistor P7 is connected to the gate of the nMOS transistor N20 of the input section 12. These elements constitute a control section 24 of embodiment 4.

In the above structure of embodiment 4, the number of MOS transistors is decreased by 1 as compared with embodiment 3. That is, the pMOS transistor P6 of FIG. 8 is commonly employed, whereby one pMOS transistor is removed.

As described above, according to embodiment 4, the number of MOS transistors is the same as that of the circuit of conventional example 1 of FIG. 11, but the number of serially-connected nMOS transistors to which a data signal is applied is decreased from 4 to 3, whereby the operation speed in the normal operation is improved. In the test operation which does not require high speed operation as compared with the normal operation, the number of serially-connected nMOS transistors to which test input signal SI is applied is set to 4. Therefore, the number of MOS transistors is decreased from 35 to 28, i.e., by 7, as compared with the circuit of conventional example 2 of FIG. 12. Thus, an increase in the speed of the normal operation and a reduction in the circuit area are achieved at the same time.

Figure 9:
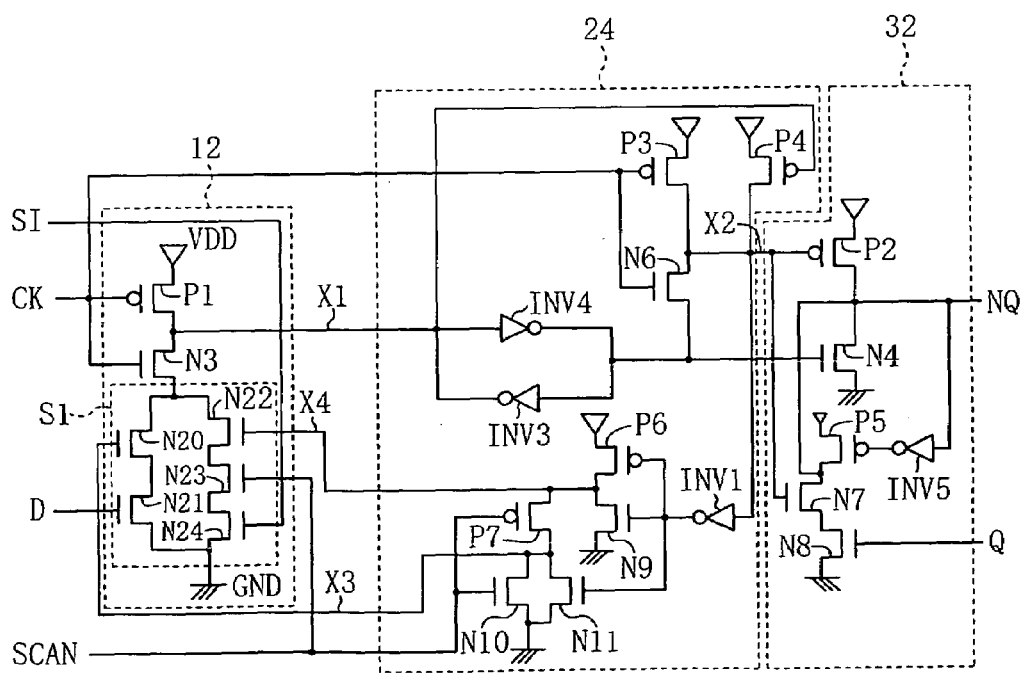
FIG. 9 shows another example of a scan flip flop circuit according to embodiment 4 of the present invention.

In the example of FIG. 8, the gate of the pMOS transistor P4 is connected to the inverted output signal terminal NQ. However, the gate of the pMOS transistor P4 may be connected to the node X1 as shown in FIG. 9.

(Embodiment 5)

Hereinafter, a semiconductor device according to embodiment 5 of the present invention and a method for producing the semiconductor device are described.

Figure 10:
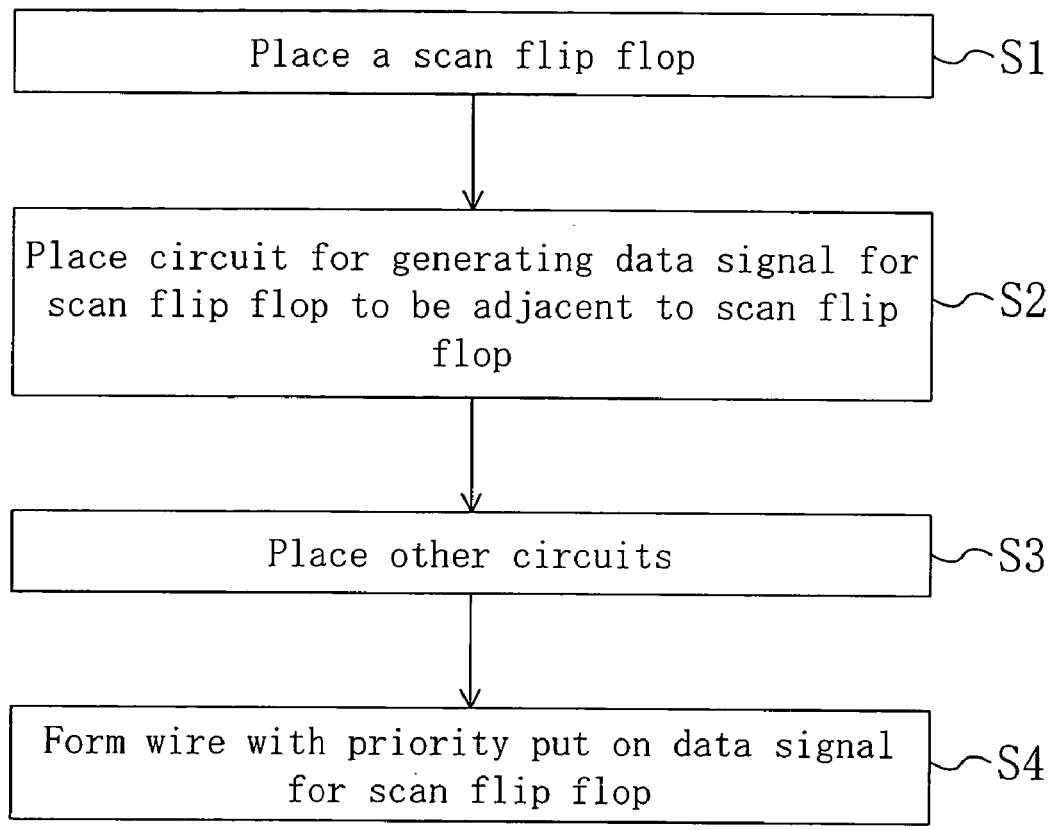
FIG. 10 is a flowchart which illustrates a production method of a semiconductor device according to embodiment 5 of the present invention.

FIG. 10 is a flowchart which illustrate a production method of the semiconductor device of embodiment 5. The production method of the semiconductor device includes: step S1 of placing a scan flip flop; step S2 of placing a data signal generation circuit for generating a data signal for the scan flip flop to be adjacent to the scan flip flop; step S3 of placing other circuits; and step S4 of forming a wire with a priority put on the data signal for the scan flip flop.

According to embodiment 5, the wire length of a signal line for data signal D is decreased, and the noise (crosstalk noise) which is caused by a signal transition on a signal line adjacent to the signal line of data signal D is reduced. As a result, a malfunction is prevented from occurring due to the crosstalk noise given to data signal D during a period between a change of a clock signal and a change of the output. Especially in the case of a dynamic circuit structure where data signal D is input to only an nMOS transistor as described in conventional examples 1 and 2 and embodiments 1 to 4 of the present invention, the operation of the circuit is more susceptible to noise as compared with a CMOS structure where data signal D is input to both pMOS transistor and nMOS transistor. Thus, the semiconductor device production method of embodiment 5 is effective.

According to embodiment 5, a semiconductor device which stably operates can be produced.

(Embodiment 6)

Figure 13:
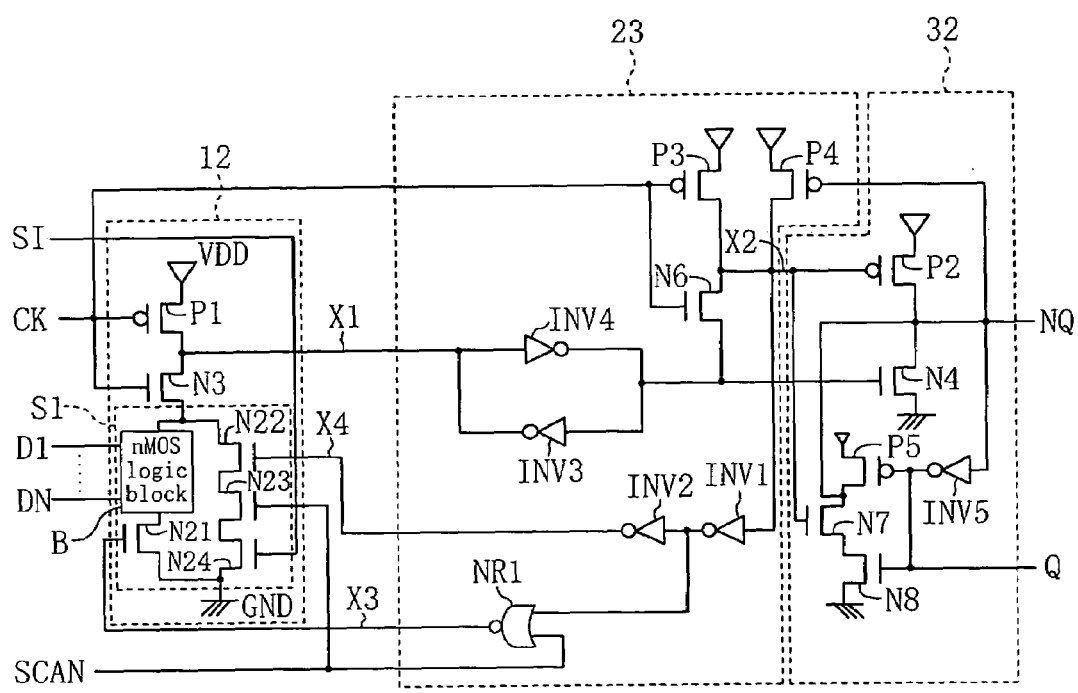
FIG. 13 shows a scan flip flop circuit according to embodiment 6 of the present invention.
Figure 14:
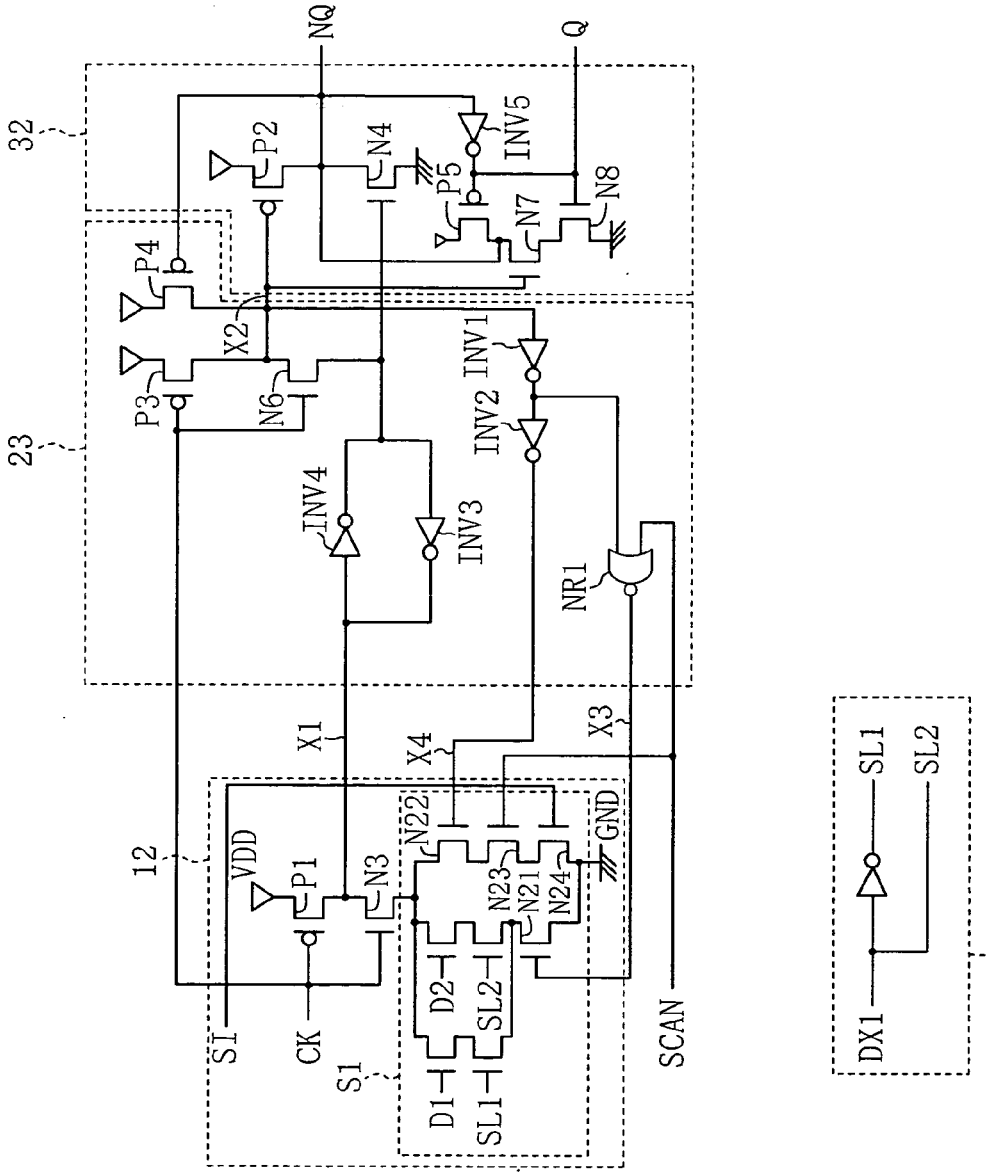
FIG. 14 shows details of the scan flip flop circuit according to embodiment 6 of the present invention.

FIGS. 13 and 14 are circuit diagrams showing scan flip flops according to embodiment 6. It should be noted that, in embodiment 6, the same circuit components as those shown in the circuit diagrams of FIGS. 1, 3 and 5 in embodiments 1 to 3 are denoted by the same reference numerals, and the descriptions thereof are omitted.

In FIG. 13, "D1" to "DN" denote a plurality of input signals. An NMOS logic block B is a logic circuit formed by nMOS transistors.

In FIG. 14, "D1" and "D2" denote data input signals, "DX" denotes a data selection signal, "SL1" and "SL2" denote selection signals obtained based on data selection signal DX, and "N25" to "N28" denote nMOS transistors.

The circuit of FIG. 13 has the same structure as that of embodiment 3 shown in FIG. 5 except that the nMOS transistor N20 of embodiment 3 is replaced by an nMOS logic block.

The circuit of FIG. 14 is an example of the circuit shown in FIG. 13 wherein the NMOS transistor logic block is realized by four nMOS transistors such that the 2-input multiplexer function is realized.

When selection signal SL1 is at the high level, selection signal SL2 is at the low level, and test selection signal SCAN is at the low level, output signals Q and NQ change according to the value of data input signal D1 at the timing when clock signal CK transitions from the low level to the high level.

When selection signal SL1 is at the low level, selection signal SL2 is at the high level, and test selection signal SCAN is at the low level, output signals Q and NQ change according to the value of data input signal D2 at the timing when clock signal CK transitions from the low level to the high level.

When test selection signal SCAN is at the high level, output signals Q and NQ change according to the value of test input signal SI irrespective of the values of selection signals SL1 and SL2 at the timing when clock signal CK transitions from the low level to the high level. Thus, the scan flip flop of embodiment 6 additionally incorporates a 2-input multiplexer.

Figure 15:
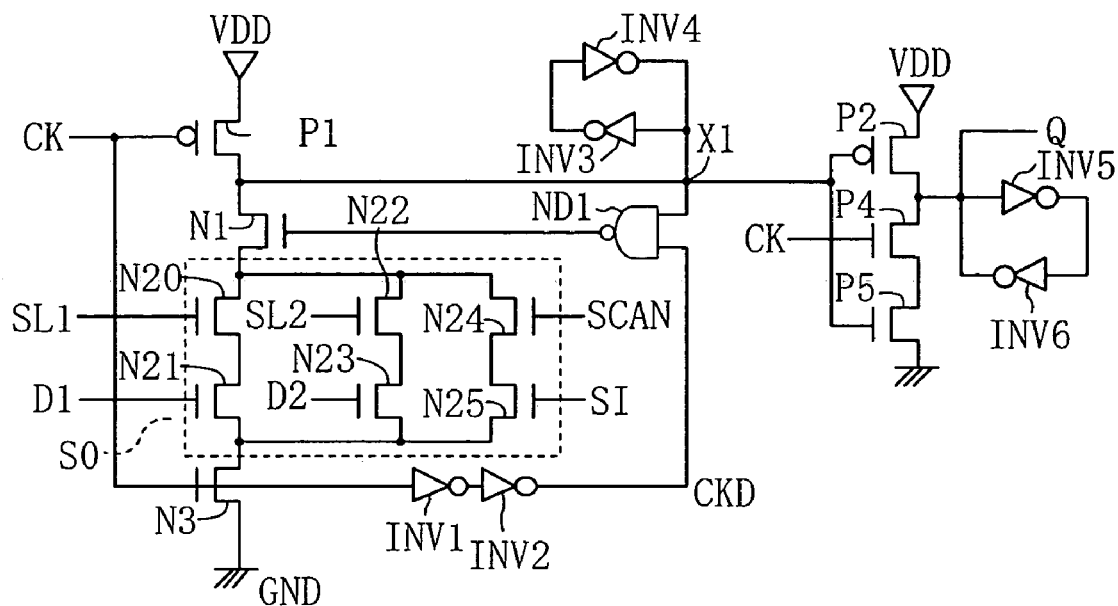
FIG. 15 shows a scan flip flop circuit of conventional example 3.
Figure 15:
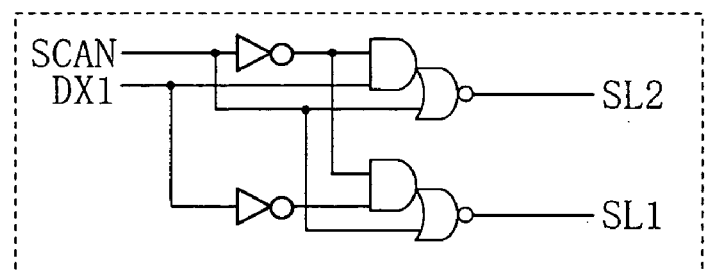

FIG. 15 shows an alternative example of the circuit of FIG. 11, which uses a multiplexer structure.

The example of FIG. 15 employs a multiplexer structure of the above-described nMOS logic block B at the data input side of the selector circuit S1 in the input section of the conventional scan flip flop of FIG. 11. The example of FIG. 15 is different from the example of FIG. 11 in that the nMOS transistors N20 and N21 and the inverter INV7 of FIG. 11 are omitted but, instead, nMOS transistors N21 and N23 which respectively receive two data signals D1 and D2 are provided in parallel, and nMOS transistors N20 and N22 which respectively receive signals SL1 and SL2 derived from data selection signal DX1 are connected in series to the nMOS transistors N21 and N23 for switching data signals D1 and D2, respectively.

The difference of FIG. 15 from FIG. 11 is not such that only the nMOS transistor N21 is omitted and the nMOS logic block B is inserted instead as is for the difference of FIG. 14 from FIG. 5, but such that the nMOS transistor N20 to which test selection signal SCAN is input through the inverter INV7 is also omitted together.

Herein, the example of FIG. 11 may have a structure wherein only the nMOS transistor N21 is different as is for the difference of FIG. 14 from FIG. 5. In this case, an electric path for discharging the node X1 includes serially-connected 5 nMOS transistors. In this case where 5 nMOS transistors are connected in series between the node X1 and ground GND, there is a higher possibility that discharge of the node X1 is delayed at a rising of clock signal CK during when data input signals D1 and D2, and the like, are at the high level, a node ND1 transitions from the high level to the low level before the node X1 transitions from the high level to the low level, and accordingly, the nMOS transistor N1 is turned off before the completion of the discharge of the node X1. As a result, the node X1 is placed at the high level, and output Q, which is supposed to be at the high level, is placed at the low level. This causes a malfunction. In consideration of such an undesirable possibility, it is desirable in view of the operation stability to decrease the number of nMOS transistors included in the electric path for discharging the node X1 as small as possible. The conventional structure of FIG. 15 is compared with the structure of embodiment 6 of the present invention.

In the scan flip flop circuit of FIG. 15, the nMOS transistor N21 to which test selection signal SCAN is omitted from the serially-connected transistors at the data input side. Therefore, when test selection signal SCAN is at the high level and test input signal SI is at the high level in the selection circuit, it is necessary to place both signals SL1 and SL2 at the low level. Thus, the scan flip flop of FIG. 15 requires a circuit for placing signals SL1 and SL2 at the low level during when test selection signal SCAN is at the high level. The example of FIG. 15 includes a selection signal generation circuit SLC0 which places signals SL1 and SL2 at the low level during when test selection signal SCAN is at the high level and places any of signals SL1 and SL2 at the low level according to data selection signal DX1 during when test selection signal SCAN is at the low level to select any of data signals D1 and D2 as a predetermined effective data signal.

In the conventional technique, selection signals SL1 and SL2 which select data signal D1 when original selection signal DX1 is at the low level but select data signal D2 when original selection signal DX1 is at the high level, and which are at the low level when test selection signal SCAN is at the high level, are expressed as follows:

$SL1=!(SCAN+!SCAN \cdot !DX1)$ $SL2=!(SCAN+!SCAN \cdot DX1)$ where symbol "!" means logic inversion, symbol "+" means logical addition, and symbol "·" means logical multiplication. In the case where this logical structure is realized in the form of a CMOS circuit, at least 16 transistors are necessary.

In a scan flip flop incorporating a multiplexer function according to embodiment 6 of the present invention, when test selection signal SCAN is at the high level, selection signals SL1 and SL2 may take any values. Therefore, selection signals SL1 and SL2 are:

$SL1=!DX1$ $SL2=DX1$

Thus, the scan flip flop of embodiment 6 requires only one inverter circuit, and the number of transistors used is 2.

According to embodiment 6, the functions of a flip flop are increased, and at the same time, the circuit area of an entire chip is reduced.

What is claimed is:

1. A scan flip flop, comprising:
an input section including a plurality of nMOS transistors, which receives first logic information and outputs second logic information based on the first logic information, the first logic information including a clock signal, a data signal, a test input signal, and a test selection signal;
an output section for receiving information generated based on at least the second logic information and outputting a signal based on the second logic information;
a control section for outputting to the input section a control signal which is used by the input section for generating the second logic information from the first logic information; and
a first node for transmitting the second logic information from the input section to the output section,
wherein the input section includes a selection section for selecting, based on the test selection signal, which of the data signal and the test input signal of the first logic information is validated to generate the second logic information when the clock signal transitions from the low level to the high level,
the input section outputs the second logic information to the first node as a high level signal when the clock signal is at the low level, and
the number of the nMOS transistors included in a route through which an electric current flows when the first node transitions from the high level to the low level in the input section is greater when the test input signal is selected than when the data signal is selected.

2. The scan flip flop according to claim 1, wherein:
the input section is connected to the control section through first, second and third nodes to operate such that
when the clock signal is at the low level, the input section outputs a high level signal to the first node,
in the case where the data signal is at the high level, if the potential of the third node is at the high level when the input state transitions from the first state where the test selection signal is at the low level and the clock signal is at the low level to the second state where the test selection signal is at the low level and the clock signal is at the high level, the input section shifts the potential of the first node from the high level to the low level within a predetermined time and retains the potential of the first node at the low level during the second state irrespective of the levels of the data signal and the test input signal,
in the case where the data signal is at the low level, when the input state transitions from the first state to the second state, the input section retains the potential of the first node at the high level, and when the potentials of the second and third nodes transition from the high level to the low level at a time after the lapse of the predetermined time, the input section retains the potential of the first node at the high level during the second state irrespective of the levels of the data signal and the test input signal,
in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level within a predetermined time and retains the potential of the first node at the low level during the fourth state irrespective of the levels of the data signal and the test input signal,
in the case where the test input signal is at the low level, if the potential of the third node is at the low level at the transition of the input state from the third state to the fourth state, the input section retains the potential of the first node at the high level, and when the potential of the second node transitions from the high level to the low level at a time after the lapse of the predetermined time, the input section retains the potential of the first node at the high level during the fourth state irrespective of the levels of the data signal and the test input signal;

the control section operates such that:

in the case where the data signal is at the low level, when the input state transitions from the first state to the second state, the control section shifts the potentials of the second and third nodes from the high level to the low level at a time after the lapse of the predetermined time, in the case where the test input signal is at the low level, when the input state transitions from the third state to the fourth state, the control section shifts the potential of the second node from the high level to the low level at a time after the lapse of the predetermined time and retains the potential of the third node at the low level; and the output section operates such that when the clock signal is at the high level, the output section outputs an inversion signal of a signal at the first node as an output signal, and when the clock signal is at the low level, the output section retains the level of a previous signal.

3. The scan flip flop according to claim 1, wherein:

the input section is connected to the control section through first, second and third nodes to operate such that when the clock signal is at the low level, the input section outputs a high level signal to the first node, in the case where the data signal is at the high level, if the potential of the third node is at the high level when the input state transitions from the first state where the test selection signal is at the low level and the clock signal is at the low level to the second state where the test selection signal is at the low level and the clock signal is at the high level, the input section shifts the potential of the first node from the high level to the low level and retains the potential of the first node at the low level during the second state irrespective of the states of the data signal and the test input signal, in the case where the data signal is at the low level, when the input state transitions from the first state to the second state, the input section retains the potential of the first node at the high level, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level and retains the potential of the first node at the low level during the fourth state irrespective of the levels of the data signal and the test input signal, and in the case where the test input signal is at the low level, if the potential of the third node is at the low level at the transition of the input state from the third state to the fourth state, the input section retains the potential of the first node at the high level;

the control section operates such that in the case where the data signal is at the high level, at the transition of the input state from the first state to the second state, the control section retains the potentials of the second and third nodes at the high level according to a potential change of the first node from the high level to the low level, in the case where the data signal is at the low level, at the transition of the input state from the first state to the second state, the control section shifts the potentials of the second and third nodes from the high level to the low level according to a signal at the first node which is retained at the high level, in the case where the test input signal is at the high level, at the transition of the input state from the third state to the fourth state, the control section retains the potentials of the second and third nodes at the high level according to a potential change of the first node from the high level to the low level, and in the case where the test input signal is at the low level, at the transition of the input state from the third state to the fourth state, the control section shifts the potential of the second node from the high level to the low level and retains the potential of the third node at the low level according to a signal at the first node which is retained at the high level; and the output section operates such that when the clock signal is at the high level, the output section outputs an inversion signal of a signal at the first node as an output signal, and when the clock signal is at the low level, the output section retains the level of a previous signal.

4. The scan flip flop according to claim 1, wherein:

the input section and the control section is connected to each other through first, second and third nodes;

the control section and the output section are connected to each other through the fourth and fifth nodes;

the input section operates such that when the clock signal is at the low level, the input section outputs a high level signal to the first node, in the case where the data signal is at the high level, if the potential of the third node is at the high level when the input state transitions from the first state where the test selection signal is at the low level and the clock signal is at the low level to the second state where the test selection signal is at the low level and the clock signal is at the high level, the input section shifts the potential of the first node from the high level to the low level and retains the potential of the first node at the low level during the second state irrespective of the potentials of the data signal and the test input signal, in the case where the data signal is at the low level, when the input state transitions from the first state to the second state, the input section retains the potential of the first node at the high level, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level and retains the potential of the first node at the low level during the fourth state irrespective of the potentials of the data signal and the test input signal, and in the case where the test input signal is at the low level, if the potential of the third node is at the low level at the transition of the input state from the third state to the fourth state, the input section retains the potential of the first node at the high level;

the control section operates such that in the case where the data signal is at the high level, at the transition of the input state from the first state to the second state, the control section retains the potentials of the second and third nodes at the high level, retains the potential of the fourth node at the high level, and shifts the potential of the fifth node from the low level to the high level, according to a signal at the first node which transitions from the high level to the low level, in the case where the data signal is at the low level, at the transition of the input state from the first state to the second state, the control section shifts the potentials of the second and third nodes from the high level to the low level, shifts the potential of the fourth node from the high level to the low level, and retains the potential of the fifth node at the low level, according to a signal at the first node which is retained at the high level, in the case where the test input signal is at the high level, at the transition of the input state from the third state to the fourth state, the control section retains the potential of the second node at the high level and the potential of the third node at the low level, retains the potential of the fourth node at the high level, and shifts the potential of the fifth node from the low level to the high level, according to a signal at the first node which transitions from the high level to the low level, and in the case where the test input signal is at the low level, at the transition of the input state from the third state to the fourth state, the control section shifts the potential of the second node from the high level to the low level, retains the potential of the third node at the low level, shifts a signal at the fourth node from the high level to the low level, and retains the potential of the fifth node at the low level, according to a signal at the first node which is retained at the high level; and the output section operates such that when the output section receives high level signals from the fourth and fifth node, the output section outputs a high level output signal and a low level inverted output signal, when the output section receives low level signals from the fourth and fifth node, the output section outputs a low level output signal and a high level inverted output signal, and when a high level signal is received at the fourth node and a low level signal is received at the fifth node, the output section retains the levels of the output signal and the inverted output signal at previous levels.

5. The scan flip flop according to claim 1, wherein the number of the nMOS transistors included in a route through which an electric current flows when the first node transitions from the high level to the low level is smaller in a case where the data signal is selected than in a case where the test input signal is selected.

6. The scan flip flop according to claim 1, wherein:
the number of the nMOS transistors is 3 when the data signal is selected; and
the number of the nMOS transistors is 4 when the test input signal is selected.

7. The scan flip flop according to claim 1, wherein:
the number of the nMOS transistors is 2 when the data signal is selected; and
the number of the nMOS transistors is 3 when the test input signal is selected.

8. The scan flip flop according to claim 1, wherein
the control section operates such that
in the case where the data signal is at the high level, at the transition of the input state from the first state to the second state, the control section outputs a high level signal to the fifth node according to a potential change of the first node from the high level to the low level, in the case where the data signal is at the low level, at the transition of the input state from the first state to the second state, the control section outputs a low level signal to the fifth node according to a signal at the first node which is retained at the high level, in the case where the test input signal is at the high level, at the transition of the input state from the third state to the fourth state, the control section outputs a high level signal to the fifth node according to a potential change of the first node from the high level to the low level, in the case where the test input signal is at the low level, at the transition of the input state from the third state to the fourth state, the control section outputs a low level signal to the fifth node according to a signal at the first node which is retained at the high level; and the control section further comprises
a sixth node for transmitting an inversion signal of a signal at the fourth node,
an inverter circuit between the sixth node and the second node for transmitting an inversion signal of a signal at the sixth node to the second node, and
a 2-input NOR circuit which receives the signal at the sixth node and the test selection signal and outputs a result of a NOR logic operation of the received signals to the third node.

9. The scan flip flop according to claim 8, wherein:
the 2-input NOR circuit is formed by a series connection of a series circuit of two pMOS transistors and a parallel circuit of two nMOS transistors, one of the pMOS transistors being connected to a supply potential, the nMOS transistors being connected to a ground potential;
the inverter circuit is a CMOS inverter; and
the pMOS transistor of the 2-input NOR circuit which is connected to the supply potential and a pMOS transistor included in the CMOS transistor are realized by one pMOS transistor.

10. A semiconductor device, comprising:
the scan flip flop of claim 1; and
a data signal generation circuit for generating the data signal which is to be input to the scan flip flop,
wherein the data signal generation circuit is placed adjacent to the scan flip flop.

11. A semiconductor device production method, comprising the steps of:
forming the scan flip flop of claim 1;

forming a data signal generation circuit for generating a data signal for the scan flip flop to be adjacent to the scan flip flop;
forming a circuit other than the data signal generation circuit; and
forming a wire for the data signal for the scan flip flop prior to forming other wires.

12. A scan flip flop, comprising:
an input section including a plurality of nMOS transistors, which receives first logic information and outputs second logic information based on the first logic information, the first logic information including a clock signal, a data signal group containing a plurality of data signals, a data selection signal, a test input signal, and a test selection signal;
an output section for receiving information generated based on at least the second logic information and outputting a signal based on the second logic information;
a control section for outputting to the input section a control signal which is used by the input section for generating the second logic information from the first logic information; and
a first node for transmitting the second logic information from the input section to the output section,
wherein the input section includes a selection section for selecting, based on the test selection signal, which of the data signal group and the test input signal of the first logic information is validated to generate the second logic information when the clock signal transitions from the low level to the high level,
the input section includes in the selection section an nMOS logic block which receives the data signal group and selects among the input data signal group a predetermined validated data signal based on the data selection signal,
the input section outputs the second logic information to the first node as a high level signal when the clock signal is at the low level,
the input section is connected to the control section through first, second and third nodes to operate such that
when the clock signal is at the low level, the input section outputs a high level signal to the first node,
if the potential of the third node is at the high level when the input state transitions from the first state where the test selection signal is at the low level and the clock signal is at the low level to the second state where the test selection signal is at the low level and the clock signal is at the high level, the input section retains the potential of the first node at the high level or shifts the potential of the first node from the high level to the low level depending on a signal structure of the data signal group input to the nMOS logic block formed in the input section within a predetermined time, and when the potential of the second node transitions from the high level to the low level at a time after the lapse of the predetermined time, the input section retains the potential of the first node during the second state irrespective of the potentials of the data signal and the test input signal,
in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level within the predetermined time and retains the potential of the first node at the low level during the fourth state irrespective of the levels of the predetermined data signal and the test input signal, and
in the case where the test input signal is at the low level, when the input state transitions from the third state to the fourth state, the input section retains the potential of the first node at the high level, and when the potential of the second node transitions from the high level to the low level at a time after the lapse of the predetermined time, the input section retains the potential of the first node at the high level during the fourth state irrespective of the levels of the predetermined data signal and the test input signal;
the control section operates such that
in the case where the predetermined data signal is at the high level, at the transition of the input state from the first state to the second state, the control section retains the potentials of the second and third nodes at the high level according to a potential change of the first node from the high level to the low level,
in the case where the predetermined data signal is at the low level, at the transition of the input state from the first state to the second state, the control section shifts the potentials of the second and third nodes from the high level to the low level according to a signal at the first node which is retained at the high level,
in the case where the test input signal is at the high level, at the transition of the input state from the third state to the fourth state, the control section retains the potential of the second node at the high level and retains the potential of the third node at the low level according to a potential change of the first node from the high level to the low level, and
in the case where the test input signal is at the low level, at the transition of the input state from the third state to the fourth state, the control section shifts the potential of the second node from the high level to the low level and retains the potential of the third node at the low level according to a signal at the first node which is retained at the high level; and
the output section operates such that
when the clock signal is at the high level, the output section outputs an inversion signal of a signal at the first node as an output signal, and
when the clock signal is at the low level, the output section retains the level of a previous signal.

13. A scan flip flop, comprising:
an input section including a plurality of nMOS transistors, which receives first logic information and outputs second logic information based on the first logic information, the first logic information including a clock signal, a data signal group containing a plurality of data signals, a data selection signal, a test input signal, and a test selection signal;
an output section for receiving information generated based on at least the second logic information and outputting a signal based on the second logic information;
a control section for outputting to the input section a control signal which is used by the input section for generating the second logic information from the first logic information; and a first node for transmitting the second logic information from the input section to the output section, wherein the input section includes a selection section for selecting, based on the test selection signal, which of the data signal group and the test input signal of the first logic information is validated to generate the second logic information when the clock signal transitions from the low level to the high level, the input section includes in the selection section an nMOS logic block which receives the data signal group and selects among the input data signal group a predetermined validated data signal based on the data selection signal, the input section outputs the second logic information to the first node as a high level signal when the clock signal is at the low level, the input section and the control section is connected to each other through first, second and third nodes, the control section and the output section are connected to each other through the fourth and fifth nodes, the input section operates such that when the clock signal is at the low level, the input section outputs a high level signal to the first node, if the potential of the third node is at the high level when the input state transitions from the first state where the test selection signal is at the low level and the clock signal is at the low level to the second state where the test selection signal is at the low level and the clock signal is at the high level, the input section retains the potential of the first node at the high level or shifts the potential of the first node from the high level to the low level within a predetermined time depending on a signal structure of the data signal group input to the nMOS logic block formed in the input section, and during the second state, the input section retains the potential of the first node at the low level irrespective of the potentials of the predetermined data signal and the test input signal, in the case where the test input signal is at the high level, if the potential of the second node is at the high level when the input state transitions from the third state where the test selection signal is at the high level and the clock signal is at the low level to the fourth state where the test selection signal is at the high level and the clock signal is at the high level, the input section shifts the potential of the first node from the high level to the low level and retains the potential of the first node at the low level during the fourth state irrespective of the potentials of the data signal and the test input signal, and in the case where the test input signal is at the low level, if the potential of the third node is at the low level at the transition of the input state from the third state to the fourth state, the input section retains the potential of the first node at the high level;

the control section operates such that in the case where the predetermined data signal is at the high level, at the transition of the input state from the first state to the second state, the control section retains the potentials of the second and third nodes at the high level, retains the potential of the fourth node at the high level, and shifts the potential of the fifth node from the low level to the high level, according to a signal at the first node which transitions from the high level to the low level, in the case where the predetermined data signal is at the low level, at the transition of the input state from the first state to the second state, the control section shifts the potentials of the second and third nodes from the high level to the low level, shifts the potential of the fourth node from the high level to the low level, and retains the potential of the fifth node at the low level, according to a signal at the first node which is retained at the high level, in the case where the test input signal is at the high level, at the transition of the input state from the third state to the fourth state, the control section retains the potential of the second node at the high level and the potential of the third node at the low level, retains the potential of the fourth node at the high level, and shifts the potential of the fifth node from the low level to the high level, according to a signal at the first node which transitions from the high level to the low level, and in the case where the test input signal is at the low level, at the transition of the input state from the third state to the fourth state, the control section shifts the potential of the second node from the high level to the low level, retains the potential of the third node at the low level, shifts a signal at the fourth node from the high level to the low level, and retains the potential of the fifth node at the low level, according to a signal at the first node which is retained at the high level; and the output section operates such that when the output section receives high level signals from the fourth and fifth node, the output section outputs a high level output signal and a low level inverted output signal, when the output section receives low level signals from the fourth and fifth node, the output section outputs a low level output signal and a high level inverted output signal, and when a high level signal is received at the fourth node and a low level signal is received at the fifth node, the output section retains the levels of the output signal and the inverted output signal at previous levels.

14. The scan flip flop according to claim 12 or 13, further comprising a selection signal generation section which receives the data selection signal and outputs to the nMOS logic block a signal selected based on the data selection signal which is used for selecting the predetermined data signal among the data signal group input to the nMOS logic block.

15. The scan flip flop according to claim 14, wherein:
the data signal group includes two data signals;
the nMOS logic block includes first nMOS transistors which respectively receive the two data signals and second nMOS transistors which receive signals selected based on the data selection signal, the second nMOS transistors being connected in series to the first nMOS transistors on a one-to-one basis, the pairs of serially-connected first and second nMOS transistors being connected in parallel; and
the selection signal generation section inputs the data selection signal as received and an inversion signal of the data selection signal to the second nMOS transistors in the nMOS logic block.

* * * * *